(12) United States Patent
Park et al.

(10) Patent No.: US 11,804,444 B2
(45) Date of Patent: Oct. 31, 2023

(54) SEMICONDUCTOR PACKAGE INCLUDING HEAT DISSIPATION STRUCTURE

(71) Applicant: SAMSUNG ELECTRONICS CO., LTD., Suwon-si (KR)

(72) Inventors: Yongjin Park, Yongin-si (KR); Myungsam Kang, Hwaseong-si (KR); Youngchan Ko, Seoul (KR); Seonho Lee, Cheonan-si (KR)

(73) Assignee: SAMSUNG ELECTRONICS CO., LTD.

( * ) Notice: Subject to any disclaimer, the term of this patent is extended or adjusted under 35 U.S.C. 154(b) by 188 days.

(21) Appl. No.: 17/008,961

(22) Filed: Sep. 1, 2020

(65) Prior Publication Data
US 2021/0233826 A1 Jul. 29, 2021

(30) Foreign Application Priority Data
Jan. 28, 2020 (KR) ........................ 10-2020-0010033

(51) Int. Cl.
*H01L 23/538* (2006.01)
*H01L 23/373* (2006.01)
*H01L 23/498* (2006.01)
*H01L 21/48* (2006.01)

(52) U.S. Cl.
CPC ...... *H01L 23/5389* (2013.01); *H01L 23/3735* (2013.01); *H01L 23/49827* (2013.01); *H01L 23/49838* (2013.01); *H01L 21/486* (2013.01); *H01L 21/4857* (2013.01); *H01L 2225/1094* (2013.01)

(58) Field of Classification Search
CPC ............. H01L 23/5389; H01L 23/3735; H01L 23/3672; H01L 23/3736; H01L 23/3733; H01L 23/49838; H01L 23/5386; H01L 23/49822; H01L 23/5383; H01L 23/49877; H01L 23/318; H01L 23/367; H01L 23/13; H01L 21/4857; H01L 2225/06589; H01L 2225/1094; H01L 2225/1035
See application file for complete search history.

(56) References Cited

U.S. PATENT DOCUMENTS

| | | | |
|---|---|---|---|
| 9,252,031 B2 | 2/2016 | Im et al. | |
| 9,299,651 B2 | 3/2016 | Lin et al. | |
| 9,318,411 B2 | 4/2016 | Lin et al. | |
| 9,583,474 B2 | 2/2017 | Lin et al. | |
| 9,870,947 B1 | 1/2018 | Campos et al. | |
| 9,870,975 B1 | 1/2018 | Wang et al. | |
| 2016/0204080 A1* | 7/2016 | Kim ........................ | H01L 25/50 438/109 |
| 2017/0154878 A1 | 6/2017 | Kim et al. | |

(Continued)

*Primary Examiner* — Yu Chen
(74) *Attorney, Agent, or Firm* — Fish & Richardson P.C.

(57) ABSTRACT

A semiconductor package includes; a semiconductor chip including a top surface and an opposing bottom surface, a heat dissipation structure including a lower adhesive layer adhered to the top surface of the semiconductor chip, a heat dissipation layer disposed on the lower adhesive layer, and a conductive layer disposed on the heat dissipation layer, a core layer including a cavity and a lower surface, wherein a combination of the semiconductor chip and the heat dissipation structure is disposed within the cavity, and a bottom re-wiring layer including a bottom re-wiring line connected to the semiconductor chip.

19 Claims, 19 Drawing Sheets

(56) References Cited

U.S. PATENT DOCUMENTS

| | | | |
|---|---|---|---|
| 2017/0207205 A1* | 7/2017 | Kim | H01L 24/20 |
| 2018/0114739 A1* | 4/2018 | Wang | H01L 21/486 |
| 2018/0261524 A1* | 9/2018 | Huang | B32B 27/281 |
| 2019/0096862 A1 | 3/2019 | Yu et al. | |
| 2019/0139853 A1 | 5/2019 | Oh et al. | |
| 2019/0198424 A1* | 6/2019 | Lam | H01L 23/4334 |
| 2019/0237382 A1 | 8/2019 | Kim et al. | |
| 2019/0333837 A1* | 10/2019 | Kang | H01L 23/367 |
| 2019/0363043 A1* | 11/2019 | Gottwald | H01L 24/32 |
| 2020/0083137 A1* | 3/2020 | Park | H01L 23/3732 |
| 2020/0091076 A1* | 3/2020 | Kim | H01L 21/568 |
| 2020/0211938 A1* | 7/2020 | Park | H01L 23/3735 |
| 2020/0395263 A1* | 12/2020 | Kim | H01L 23/13 |
| 2021/0082881 A1* | 3/2021 | Seol | H01L 23/4334 |
| 2021/0193555 A1* | 6/2021 | Lee | H01L 23/3735 |
| 2022/0367212 A1* | 11/2022 | Lin | H01L 24/20 |

* cited by examiner

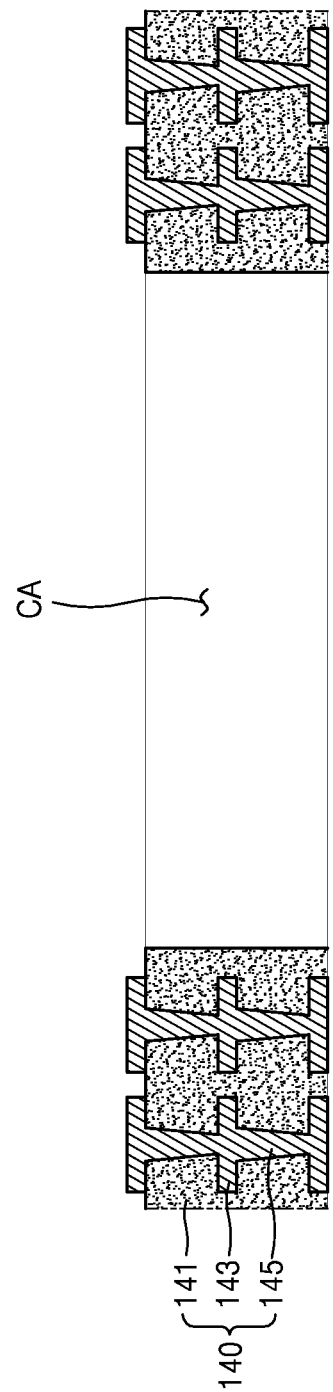

SEMICONDUCTOR PACKAGE INCLUDING HEAT DISSIPATION STRUCTURE

CROSS-REFERENCE TO RELATED APPLICATIONS

This application claims the benefit of Korean Patent Application No. 10-2020-0010033, filed on Jan. 28, 2020 in the Korean Intellectual Property Office, the subject matter of which is hereby incorporated by reference.

BACKGROUND

The inventive concept relates to semiconductor package, and more particularly to a semiconductor packages including a heat dissipation structure.

With the development of the electronics industry, there are increasing demands for high efficiency, high speed, and miniaturization of electronic components. Therefore, there is an increasing need for miniaturization and multi-functionalization of semiconductor chips used in electronic components. Also, in the semiconductor packaging field, there is a demand to implement numerous pins while miniaturizing a relatively semiconductor chip size. The fan-out type semiconductor package meets many of these emerging demands. That is, the fan-out type semiconductor package may be provide relatively more pins in an overall smaller size by providing an external connection terminals that are laterally redistributed beyond the area occupied by the semiconductor chip.

SUMMARY

The inventive concept provides semiconductor packages exhibiting excellent heat dissipation characteristics.

According to an aspect of the inventive concept, there is provided a semiconductor package including; a semiconductor chip including a top surface and an opposing bottom surface, a heat dissipation structure including a lower adhesive layer adhered to the top surface of the semiconductor chip, a heat dissipation layer disposed on the lower adhesive layer, and a conductive layer disposed on the heat dissipation layer, a core layer including a cavity and a lower surface, wherein a combination of the semiconductor chip and the heat dissipation structure is disposed within the cavity, and a bottom re-wiring layer including a bottom re-wiring line connected to the semiconductor chip.

According to an aspect of the inventive concept, there is provided a semiconductor package including; a core layer including a top surface, an opposing bottom surface and a cavity, a semiconductor chip including a top surface, an opposing bottom surface and chip pads connected to the bottom surface of the semiconductor chip, a heat dissipation structure disposed on the top surface of the semiconductor chip, wherein a combination of the semiconductor chip and the heat dissipation structure is fully disposed within the cavity, and the heat dissipation structure includes a lower adhesive layer adhered to the top surface of the semiconductor chip, a heat dissipation layer disposed on the lower adhesive layer, and a conductive layer disposed on the heat dissipation layer, a bottom re-wiring layer disposed on the bottom surface of the semiconductor chip and the bottom surface of the core layer, and including a bottom re-wiring line connected to at least one of the chips pads, an encapsulation member filling a space between the combination of the semiconductor chip and the heat dissipation structure and the core layer and covering a top surface of the heat dissipation structure, a top re-wiring layer disposed on the top surface of the semiconductor and the top surface of the core layer, including a top re-wiring line connected to the semiconductor chip, and further including at least one via that penetrates the encapsulation member to connect the conductive layer.

According to an aspect of the inventive concept, there is provided a semiconductor package including; a lower semiconductor package including a semiconductor chip including a top surface, an opposing bottom surface, and an upper semiconductor package stacked on the lower semiconductor package and including another semiconductor chip. The lower semiconductor package further includes; a core layer including a top surface, an opposing bottom surface, internal wires and a cavity, a heat dissipation structure disposed on the top surface of the semiconductor chip, wherein a combination of the semiconductor chip and the heat dissipation structure is fully disposed within the cavity, and the heat dissipation structure includes a lower adhesive layer adhered to the top surface of the semiconductor chip, a heat dissipation layer disposed on the lower adhesive layer, and a conductive layer disposed on the heat dissipation layer, a bottom re-wiring layer disposed on the bottom surface of the semiconductor chip and the bottom surface of the core layer, and including a bottom re-wiring line, an encapsulation member filling a space between the combination of the semiconductor chip and the heat dissipation structure and the core layer and covering a top surface of the heat dissipation structure, and a top re-wiring layer disposed on the top surface of the semiconductor and the top surface of the core layer and including a top re-wiring line connected to the semiconductor chip.

BRIEF DESCRIPTION OF THE DRAWINGS

Embodiments of the inventive concept will be more clearly understood from the following detailed description taken in conjunction with the accompanying drawings in which:

FIGS. 5A to 5G are related cross-sectional views illustrating in one example a method of fabricating the semiconductor package of FIG. 1B.

DETAILED DESCRIPTION

Throughout the written description an drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
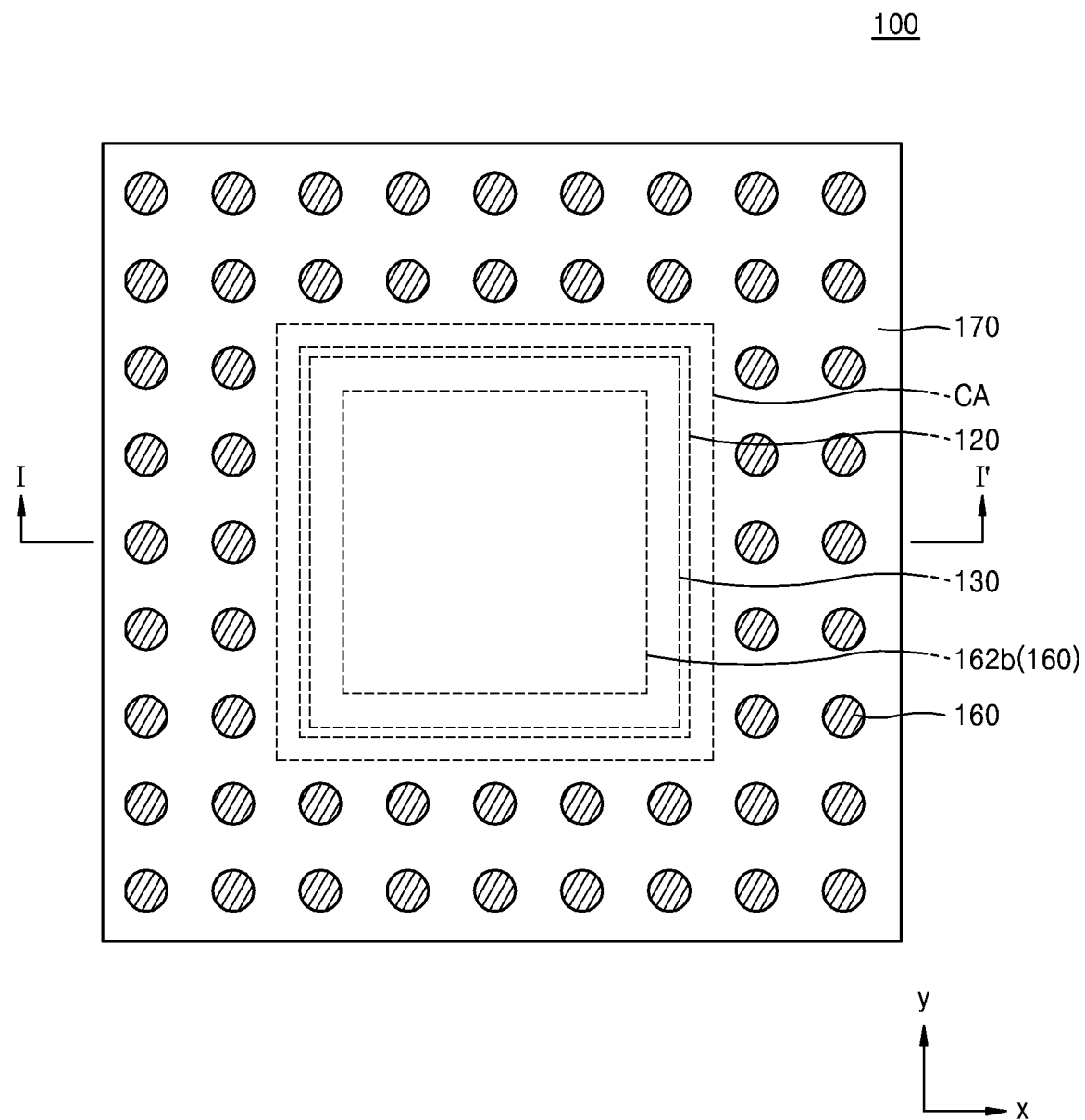
FIG. 1A is a plan view.
Figure 1B:
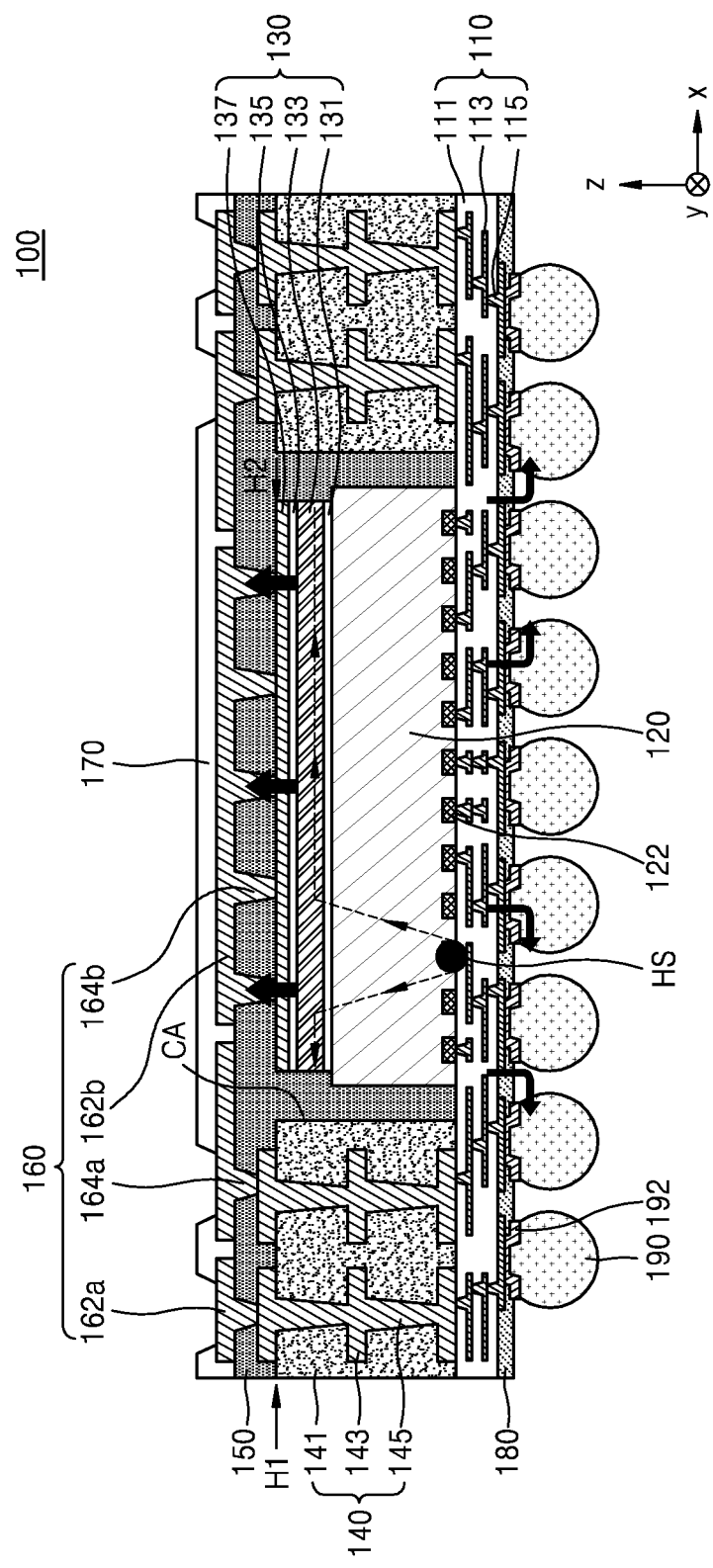
FIG. 1B is a cross-sectional view of a semiconductor package according to embodiments of the inventive concept.

FIG. 1A is a top down (or plan) view of a semiconductor package according to embodiments of the inventive concept, and FIG. 1B is a cross-sectional view taken along the line I-I' indicated in the semiconductor package of FIG. 1A.

Referring to FIGS. 1A and 1B, a semiconductor package 100 may include a bottom re-wiring layer 110, a semiconductor chip 120, a heat dissipation structure 130, a core layer 140, an encapsulation member 150, and a top re-wiring layer 160.

The bottom re-wiring layer 110 may be disposed on a bottom surface of (or under) the semiconductor chip 120 which includes re-wire chip pads 122. The bottom re-wiring layer 110 may include a lower insulating layer 111, a bottom re-wiring line 113, and a bottom via 115. The bottom re-wiring line 113 may include multiple layers, and the multiple layers may be connected to one another through the bottom via 115.

The lower insulating layer 111 may include an insulating material (e.g., a photo imageable dielectric (PID) resin) and may further include an inorganic filler. The lower insulating layer 111 may have a multiple layer structure consistent with the multiple layer structure of the bottom re-wiring line 113. However, in FIG. 1B, for convenience of explanation, the lower insulating layer 111 is shown as a single layer structure. When the lower insulating layer 111 has a multiple layer structure, each one of the multiple layers forming the lower insulating layer 111 may include the same or different material(s).

An external connection pad 192 may be provided on a bottom surface of the lower insulating layer 111, and an external connection terminal 190 may be provided on the external connection pad 192. With this configuration, the external connection terminal 190 may be electrically connected to a chip pad 122 through the bottom re-wiring line 113 of the bottom re-wiring layer 110. As shown in FIG. 1B, the external connection pad 192 and the external connection terminal 190 may be arranged under a first portion of the bottom re-wiring layer 110 underlying the bottom surface of the semiconductor chip 120 and/or a second portion of the bottom surface extending laterally outward (e.g., in a first horizontal direction, or X direction and/or in a second horizontal direction, or Y direction) from the first portion of the bottom rewiring layer 110. As a result, the bottom re-wiring layer 110 may function to rearrange (or expand) the arrangement of chip pads 122 of the semiconductor chip 120 as the external connection pad 192 on a bottom surface larger than the first portion of the bottom surface of the bottom re-wiring layer 110. As such, a package structure in which the external connection terminal 190 is more widely provided to extend beyond the bottom surface area of the semiconductor chip 120 may be referred to as a fan-out (FO) type package structure. In contrast, a package structure in which the external connection terminal 190 is provided only on the first bottom surface may be referred to as a fan-in (FI) type package structure.

The combination of the semiconductor chip 120 and the heat dissipation structure 130 may be disposed within a cavity (or through hole) CA formed in the core layer 140, and may be spaced apart from inner walls of the cavity CA. In this regard, the cavity CA may have a shape selected from a group of shapes including; a rectangle, a circle, an ellipse, and a polygon. The semiconductor chip 120 may include a logic semiconductor chip and/or a memory semiconductor chip. For example, the logic semiconductor chip may be an application processor (AP), a micro-processor, a central processing unit (CPU), a controller, or an application specific integrated circuit (ASIC). Also, the memory semiconductor chip may be, for example, a volatile memory like dynamic random access memory (DRAM) and static random dom access memory (SRAM) or a non-volatile memory like a flash memory.

The semiconductor chip 120 may include chip pads 122 provided on the bottom surface thereof. In the semiconductor package 100, the bottom surface of the semiconductor chip 120 including the chip pads 122 is an active surface, whereas the opposing, top surface may be an inactive surface. The chip pads 122 may be variously connected to other component(s) of the semiconductor chip 120 (e.g., an integrated circuit). A multiple wiring layer may be provided on the bottom surface of the semiconductor chip 120, and the chip pads 122 may be variously connected to internal circuitry (e.g., integrated circuit(s)) through the multiple wiring layer.

The heat dissipation structure 130 may be provided (or disposed) on the top surface of the semiconductor chip 120 to provide a combination of the semiconductor chip 120 and the heat dissipation structure 130. Here, the heat dissipation structure 130 may have a multiple layer structure. For example, the heat dissipation structure 130 may include a sequentially stacked arrangement including a lower adhesive layer 131, a heat dissipation layer 133, an upper adhesive layer 135, and a conductive layer 137.

The lower adhesive layer 131 may be adhered (or mechanically fixed) to the top surface of the semiconductor chip 120. The lower adhesive layer 131 may include, for example, a die attach film (DAF). However, the lower adhesive layer 131 is not limited thereto. For example, the lower adhesive layer 131 may include one or more adhesive material(s) capable of securely fixing the heat dissipation layer 133 to the top surface of the semiconductor chip 120 and smoothly transferring thermal energy (or heat) from the semiconductor chip 120 to the heat dissipation layer 133.

The heat dissipation layer 133 may include a material exhibiting a higher thermal conductivity than the semiconductor chip 120. The heat dissipation layer 133 may outwardly dissipate heat from the semiconductor chip 120. For example, the thermal conductivity of the semiconductor chip 120 may range from about 100 W/mK to about 150 W/mK, and the thermal conductivity of the heat dissipation layer 133 may range from about 300 W/mK or higher.

In certain embodiments, the heat dissipation layer 133 may include graphite, as graphite has a thermal conductivity ranging from about 1000 W/mK to about 1500 W/mK. However, the material used to form the heat dissipation layer 133 is not limited to graphite. For example, the heat dissipation layer 133 may include a metal having good thermal conductivity. However, when the heat dissipation layer 133 includes metal, a metal having a relatively small, thermal expansion coefficient difference, relative to the semiconductor chip 120 should be selected.

The upper adhesive layer 135 may adhered to the conductive layer 137 and a top surface of the heat dissipation layer 133. Here again, the upper adhesive layer 135 may include one or more adhesive material(s) exhibiting acceptable mechanical stability and excellent thermal conductivity.

The conductive layer 137 may be fixed to the heat dissipation layer 133 using the upper adhesive layer 135. The conductive layer 137 may also include a material exhibiting good thermal conductivity. For example, the conductive layer 137 may exhibit a thermal conductivity ranging from about 300 W/mK or higher. According to embodiments, the conductive layer 137 may include the same material as upper wiring layers 162a and 162b of the top re-wiring layer 160. The conductive layer 137 may include a metal like copper (Cu), for example, but is not limited thereto. The conductive layer 137 may be shaped as a flat plate (or panel) that may be stacked on the heat dissipation layer 133 by being adhered to the heat dissipation layer 133 through the upper adhesive layer 135.

The heat dissipation structure 130 may have a lateral size (e.g., an area measured in the X and Y directions) smaller than the lateral size of the upper surface of the semiconductor chip 120, as shown in FIG. 1B. However, in other embodiments, the heat dissipation structure 130 may have a lateral size that is substantially the same size as the lateral size of the semiconductor chip 120. When the heat dissipation structure 130 has the same lateral size as the semiconductor chip 120, respective side surfaces of the heat dissipation structure 130 and the semiconductor chip 120 may be laterally co-terminus (e.g., similarly bounded in the X and Y directions).

When the heat dissipation structure 130 (or respective portions of the heat dissipation structure 130) is laterally smaller than the semiconductor chip 120, the heat dissipation structure 130 may be adhered to and fixed onto the upper surface if the semiconductor chip 120 via the lower adhesive layer 131. However, when the heat dissipation structure 130 has the same lateral size as the semiconductor chip 120, a wafer-level heat dissipation structure 130 may be adhered and fixed to a semiconductor wafer via the lower adhesive layer 131, and thereafter, individual chips may be provided by (e.g.) sawing the semiconductor wafer.

The total thickness of the heat dissipation structure 130 may be less than the thickness of the semiconductor chip 120. For example, assuming that the semiconductor chip 120 has a thickness of about 100 μm, the total thickness of the heat dissipation structure 130 may range from about 40 μm to about 70 μm. However, the thickness of the heat dissipation structure 130 is not limited to this exemplary numerical range.

In certain embodiments, for example, the lower adhesive layer 131 and the upper adhesive layer 135 may each have a thickness of about 5 μm, the heat dissipation layer 133 may have a thickness of about 25 μm, and the conductive layer 137 may have a thickness of about 10 μm. However, the respective thicknesses of the constituent components of the heat dissipation structure 130 are not limited to these values.

It should be noted at this point that when the thickness of the heat dissipation structure 130, and more particularly, the thicknesses of the heat dissipation layer 133 and the conductive layer 137 are relatively large, the heat dissipation structure 130 may not be fully accommodated within the cavity CA. This outcome may increase the overall thickness of the semiconductor package 100. However, when the thicknesses of the heat dissipation layer 133 and the conductive layer 137 are relatively thin, the heat dissipation efficiency of the heat dissipation structure 139 may be low. Therefore, the respective thicknesses of the material layers forming the heat dissipation structure 130 should be selected in consideration of the size (e.g., the thickness) of the semiconductor chip 120 and the desired heat dissipation efficiency.

In the illustrated example of FIGS. 1A and 1B, a top surface of the heat dissipation structure 130 (e.g., a top surface of the conductive layer 137) may be disposed at substantially the same height (e.g., measured in the Z direction) as a top surface of the core layer 140. That is, a first height H1 of the top surface of the core layer 140 may be substantially the same as a second height H2 of the top surface of the heat dissipation structure 130. However, in other embodiments of the inventive concept, the height of the top surface of the heat dissipation structure 130 may be higher or lower than the top surface of the core layer 140.

The core layer 140 may include the cavity (e.g., a through hole) CA may extend from a top surface to a bottom surface of the core layer 140. However, in other embodiments, the cavity CA may not completely penetrate the entire thickness of the core layer 140. The cavity CA may be formed in a center portion of the core layer 140 as shown in FIG. 1A. However, the disposition of the cavity CA is not limited to only the central portion. One or more cavities CA may be formed in the core layer 140, and one or more corresponding semiconductor chip 120 may be disposed in a respective cavity CA. Alternately, two or more semiconductor chips may be disposed in a single cavity CA.

The core layer 140 may include a core insulating layer 141 at least partially surrounding a core wire 143 and a core via 145. The core wire 143 may be formed in a multiple layer structure, where the multiple layers may be electrically connected to one another through the core via 145. The illustrated example of FIG. 1B shows the core wire 143 including a three-layer structure, but this is just a selected, illustrative example. The core insulating layer 141 may be formed from multiple insulating layers corresponding to the multiple layer structure of the core wire 143. However, in FIG. 1B for convenience of explanation, the core insulating layer 141 is shown as a single layer.

The core insulating layer 141 may include one or more insulating material(s) (e.g., a thermosetting resin like an epoxy resin or a thermoplastic resin like polyimide) and may further include an inorganic filler. The core insulating layer 141 may also include a resin impregnated into a core material such as a glass fiber, a glass cloth, and/or a glass fabric together with an inorganic filler (e.g., prepreg, Ajinomoto build-up film (ABP), FR-4, Bismaleimide Triazine (BT), etc.).

The encapsulation member 150 may be provided to at least partially seal the semiconductor chip 120 (or a combination of the semiconductor chip 120 and the heat dissipation structure 130), thereby preventing possible mechanical and/or chemical damage to the semiconductor chip 120 and/or the heat dissipation structure 130. In certain embodiments of the inventive concept, the encapsulation member 150 may fill portions of the cavity CA not filled by the combination of the semiconductor chip 120 and the heat dissipation structure 130. Thus, the encapsulation member 150 may extend from top surfaces of the heat dissipation structure 130 and the core layer 140 downward into a bottom of the cavity CA.

In particular, the encapsulation member 150 may fill the lateral space between the semiconductor chip 120 and the heat dissipation structure 130 and the inner walls of the cavity CA, as well as cover at least part of the top surface of the heat dissipation structure 130 and any exposed portions of a top surface of the semiconductor chip 120. The encapsulation member 150 may also fill at least a portion of the space between the semiconductor chip 120 and the bottom re-wiring layer 110.

The encapsulation member 150 may include one or more insulating material(s) (e.g., a thermosetting resin like epoxy resin, a thermoplastic resin like polyimide, or the aforementioned resin further including a reinforcing material like an inorganic filler (e.g., ABF, FR-4, BT resin, etc.)). Additionally or alternatively, a molding material like EMC or a photosensitive material like photo-imageable encapsulant (PIE) may be used for the encapsulation member 150.

The top re-wiring layer 160 may be provided on the heat dissipation structure 130, the core layer 140, and the encapsulation member 150. The top re-wiring layer 160 may be electrically connected to the semiconductor chip 120 and the bottom re-wiring layer 110 through the core wire 143 and/or the core via 145. With this configuration, the top re-wiring layer 160 may also serve to redistribute the chip pads 122 of the semiconductor chip 120.

The top re-wiring layer 160 may include an first top wiring layer 162*a*, a second top wiring layer 162*b*, first upper vias 164*a*, and second top vias 164*b*. Here, the first top wiring layer 162*a* and the second top wiring layer 162*b* may be disposed at the same height. Also, the first upper vias 164*a* and the second top vias 164*b* may be disposed at the same height. The first top wiring layer 162*a* and the first upper vias 164*a* may be arranged on the core layer 140 and electrically connected to the core wire 143 of the core layer 140. Also, the second top wiring layer 162*b* and the second top vias 164*b* may be arranged on the heat dissipation structure 130 and connected to the conductive layer 137 of the heat dissipation structure 130.

As shown in FIG. 1A, the second top wiring layer 162*b* may be shaped as a rectangular plate and may be laterally smaller than the heat dissipation structure 130. However, the shape and size of the top wiring layer 162*b* are not limited thereto, and the top wiring layer 162*b* may have a circular, elliptical, or polygonal plate shape, for example. According to embodiments, the second top wiring layer 162*b* may include a plurality of line patterns.

The second top wiring layer 162*b* may be connected to the heat dissipation structure 130 (e.g., the conductive layer 137) through the second top vias 164*b*. The second top vias 164*b* may penetrate the encapsulation member 150 to connect the heat dissipation structure 130. According to embodiments, the top re-wiring layer 160 may further include an insulating layer on top of the encapsulation member 150. In this case, the second top vias 164*b* may penetrate through the insulating layer as well.

Moreover, the second top vias 164*b* may be arranged in a lateral (e.g., a 2-dimensional array) structure. However, the arrangement structure of the second top vias 164*b* is not so limited. The second top vias 164*b* may be arranged using a smaller pitch than the pitch used to arrange the first upper vias 164*a*. Alternately, the second top vias 164*b* may be arranged at a substantially same pitch as the first upper vias 164*a*, or may be arranged with a larger pitch than the first upper vias 164*a*.

In certain embodiments of the inventive concept, the second upper wiring layer 162*b* may be connected to the first top wiring layer 162*a*. However, when the heat dissipation structure 130 is vertically stacked on the inactive, second surface of the semiconductor chip 120, and also includes the lower adhesive layer 131 and the upper adhesive layer 135, the second upper wiring layer 162*b* may not be directly connected to the semiconductor chip 120 even in embodiments wherein the second upper wiring layer 162*b* is connected to the first top wiring layer 162*a*.

The top re-wiring layer 160 may include one or more conductive material(s) (e.g., Cu, aluminum (Al), silver (Ag), tin (Sn), gold (Au), nickel (Ni), lead (Pb), titanium (Ti), and/or alloys thereof). The first upper vias 164*a* and the second top vias 164*b* may each include a seed layer and a filling conductive layer, and may include an interior region completely filled with the conductive material(s). However, the structure of the first upper vias 164*a* and the second top vias 164*b* is not limited thereto. For example, in the first upper vias 164*a* and the second top vias 164*b*, a conductive material may be formed only along the inner walls thereof. The first upper vias 164*a* and the second top vias 164*b* may have various pillar shapes, such as a cylindrical pillar, an elliptical pillar, and a polygonal pillar, a tapered pillar-like shape, etc.

A first passivation layer 170 may be provided on the top surface of the top re-wiring layer 160, and a second passivation layer 180 may be provided on the bottom surface of the lower re-wiring layer 110. In this manner, the first passivation layer 170 and the second passivation layer 180 may cover and protect the top re-wiring layer 160 and the bottom re-wiring layer 110, respectively. The first passivation layer 170 and the second passivation layer 180 may include one or more insulating material(s) such as resin. However, the material of the first passivation layer 170 and the second passivation layer 180 is not limited thereto.

The external connection pad 192 may be connected to the bottom re-wiring line 113 exposed through openings of the second passivation layer 180, and the external connection terminal 190 may be provided on the external connection pad 192. In this manner, the external connection terminal 190 may be electrically connected to the bottom re-wiring line 113 of the bottom re-wiring layer 110. The external connection terminal 190 may connect the semiconductor package 100 to a main board of an electronic device incorporating (e.g., mounting) the semiconductor package 100. The external connection terminal 190 may include one or more conductive material(s) (e.g., solder, Sn, Ag, Cu, and/or Al).

Moreover, a portion of the first top wiring layer 162*a* exposed through an opening of the first passivation layer 170 may function as an upper connection pad. An inter-package connection terminal (See, e.g., FIG. 4A) may be provided on the upper connection pad, and at least one upper package is provided on the semiconductor package 100 through the inter-package connection terminal, and thus a package on package (POP) structure may be implemented.

The semiconductor package 100 of FIGS. 1A and 1B includes the heat dissipation structure 130 including a multiple layer disposed on the semiconductor chip 120, and thus heat generated by the semiconductor chip 120 may be efficiently out-diffused through the heat dissipation structure 130. In this manner, the heat dissipation characteristics of the semiconductor package 100 may be improved. For example, as indicated by the arrows shown in FIG. 1B, heat generated at a particular hot spot HS of the semiconductor chip 120 may be readily transferred away from the bottom surface of the semiconductor chip 120 to be outwardly diffused. Because the heat dissipation structure 130 is provided on the top surface of the semiconductor chip 120, rising heat may be rapidly diffused to the heat dissipation layer 133 which has a relatively high thermal conductivity and may then be more uniformly transferred from the heat dissipation layer 133 to the conductive layer 137 of the heat dissipation structure 130. Furthermore, as the second upper wiring layer 162*b* is provided above the heat dissipation structure 130 and the second upper wiring layer 162*b* is connected to the heat dissipation structure 130 through the second top vias 164*b*, the thermal exhaust area performing heat dissipation may be expanded from the heat dissipation structure 130 to include the second upper wiring layer 162*b*. As a result, the heat dissipation efficiency of the semiconductor package 100 is further improved.

Contemporary semiconductor chips, and semiconductor logic chips such as application processors (APs) in particular, require adequate heat dissipation characteristics in order to maintain and/or improve operating speed and overall data processing performance. Therefore, semiconductor packages consistent with embodiments of the inventive concept may be used in conjunction with a variety of semiconductor packages requiring efficient heat dissipation characteristics.

FIGS. 2A, 2B, 2C, 2D, 2E, 2F, 2G and 2H (hereafter collectively, FIGS. 2A to 2H) are cross-sectional views illustrating in various examples possible variations in certain semiconductor package according to embodiments of the inventive concept. Here, FIGS. 2A to 2G show only selected portions of the semiconductor package 100 as shown in FIG. 1B.

Figure 2A:
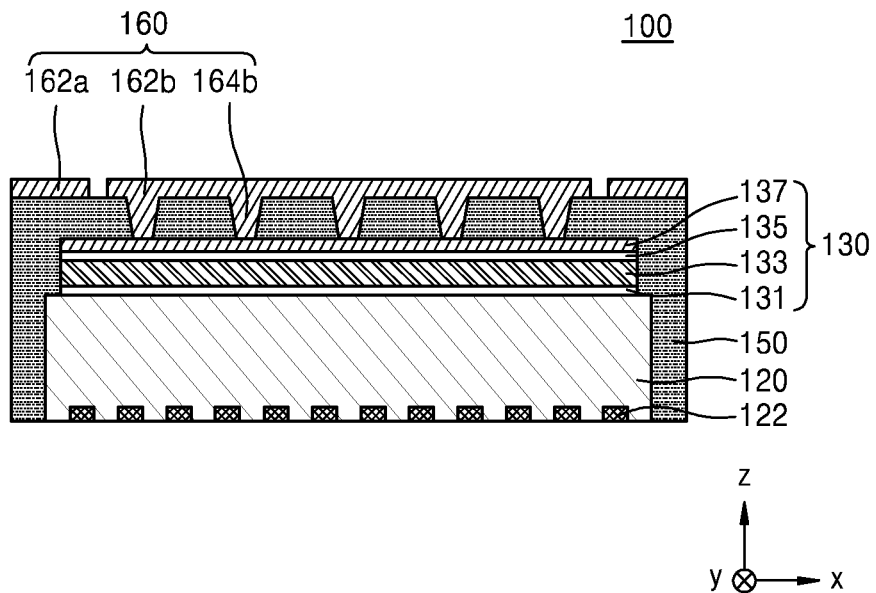
FIGS. 2A to 2H are cross-sectional views of semiconductor packages according to embodiments of the inventive concept.

Thus, referring to FIG. 2A, the semiconductor package 100 includes the cavity CA formed in the core layer 140, the semiconductor chip 120 with chip pads 122 disposed in the cavity CA, the heat dissipation structure 130 disposed on an upper surface of the semiconductor chip 120, a portion of the encapsulation member 150, and a portion of the top re-wiring layer 160.

Figure 2B:
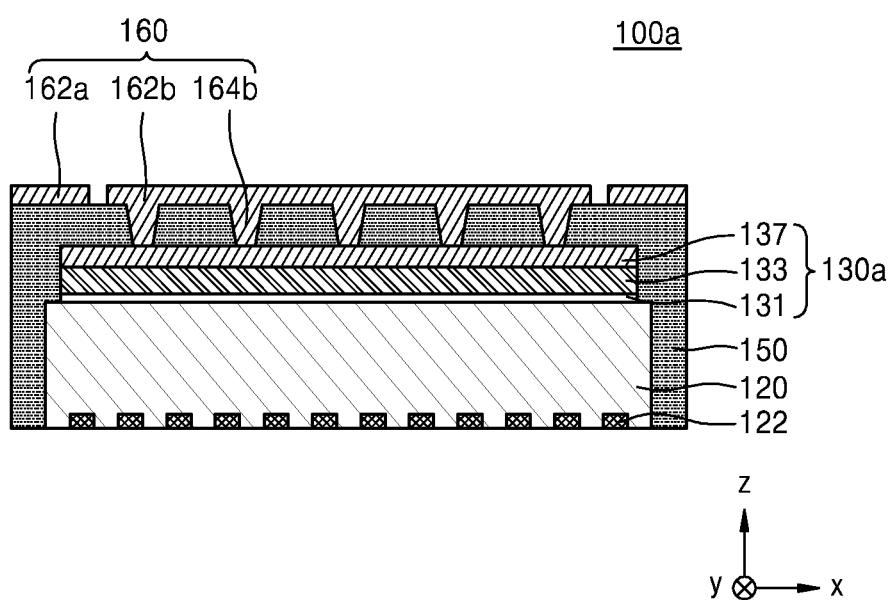

Referring to FIG. 2B, a semiconductor package 100a differs from the semiconductor package 100 of FIG. 2A in the particular structure of a heat dissipation structure 130a. That is, in the semiconductor package 100a, the heat dissipation structure 130a may include only the lower adhesive layer 131, the heat dissipation layer 133, and the conductive layer 137, thereby omitting the upper adhesive layer 135. In this regard, the heat dissipation structure 130a may include the conductive layer 137 that may be formed on the heat dissipation layer 133 using (e.g.) a through electrolytic plating or an electroless plating technique, or alternately using a vapor deposition technique.

In the semiconductor package 100a, since the upper adhesive layer is omitted, the overall thickness of the heat dissipation structure 130a may be reduced. Therefore, the semiconductor chip 120 and the heat dissipation structure 130a may be accommodated in a more shallow cavity CA of the core layer 140. Also, considering that the thermal conductivity of many adhesive materials is generally not high, omission of the upper adhesive layer may improve heat dissipation characteristics, as heat from the heat dissipation layer 133 may be directly transferred to the conductive layer 137 more efficiently.

Figure 2C:
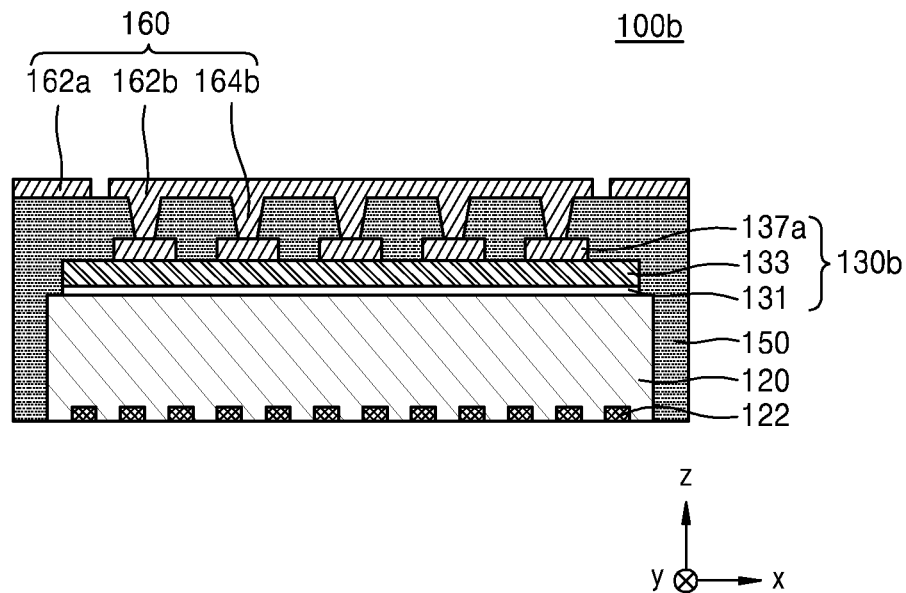

Referring to FIG. 2C, a semiconductor package 100b includes a semiconductor package 100b including a heat dissipation structure 130b. Here, the heat dissipation structure 130b includes the lower adhesive layer 131, the heat dissipation layer 133, and a conductive layer 137a, wherein the conductive layer 137a has a patterned shape instead of a flat panel shape. For example, in the heat dissipation structure 130b, the conductive layer 137a may have a shape including linear conductive patterns extending in the Y direction and spaced apart from one another in the X direction. Alternately, the conductive layer 137a may have a shape including micro conductive patterns arranged in a lateral (X/Y) array structure corresponding to a lateral array structure for the second top vias 164b. Here, the micro conductive pattern may have various shapes (e.g., circular, elliptical, and polygonal) and may be larger than the respective bottom surfaces of the second upper via 164b. The conductive layer 137a may be formed using a plating technique, for example.

Figure 2D:
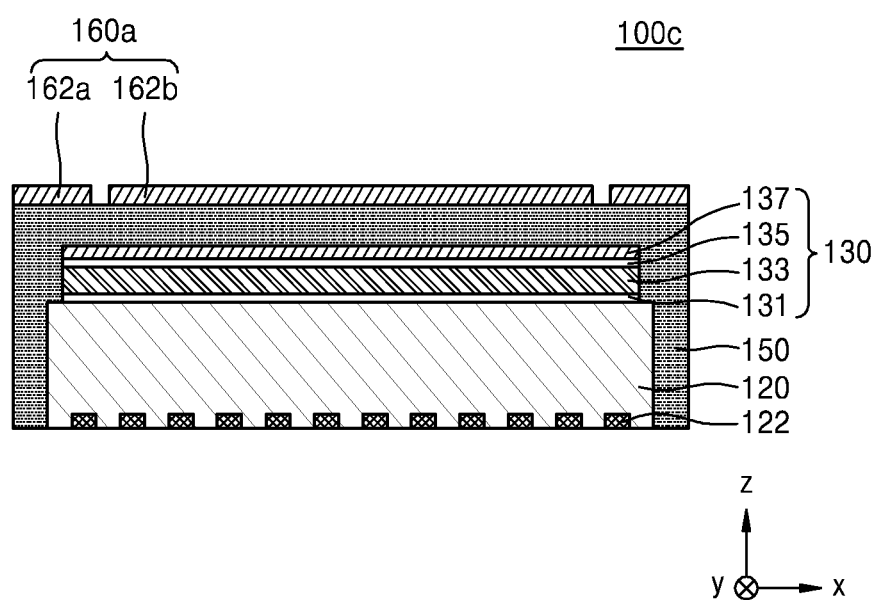

Referring to FIG. 2D, a semiconductor package 100c includes a top re-wiring layer 160a including only the second upper wiring layer 162b disposed on the encapsulation member 150 and the heat dissipation structure 130 and omitting the second top vias. That is, in the semiconductor package 100c, the heat dissipation structure 130 may not be connected to the top re-wiring layer 160a. However, although not shown in FIG. 2D, the first upper vias 164a on the core layer 140 may be maintained.

Figure 2E:
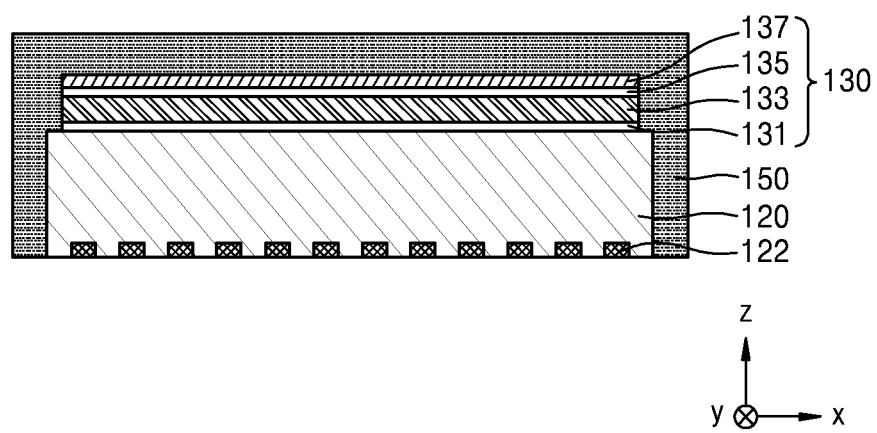

Referring to FIG. 2E, a semiconductor package 100d may completely omit the top re-wiring layer 160. That is, in the semiconductor package 100d, the second re-wiring layer may not be formed on the encapsulation member 150. For example, when an upper package will not be stacked on the semiconductor package 100d, the semiconductor package 100d need not include the second re-wiring layer and the overall packaging process may be simplified.

Moreover, according to embodiments, the second re-wiring layer may be formed on the core layer 140, whereas the second re-wiring layer may be omitted only on the encapsulation member 150 above the heat dissipation structure 130. That is, when an upper package is stacked on the semiconductor package 100d, a second re-wiring layer connected to an inter-package connection terminal may be formed only on the core layer 140.

Figure 2F:
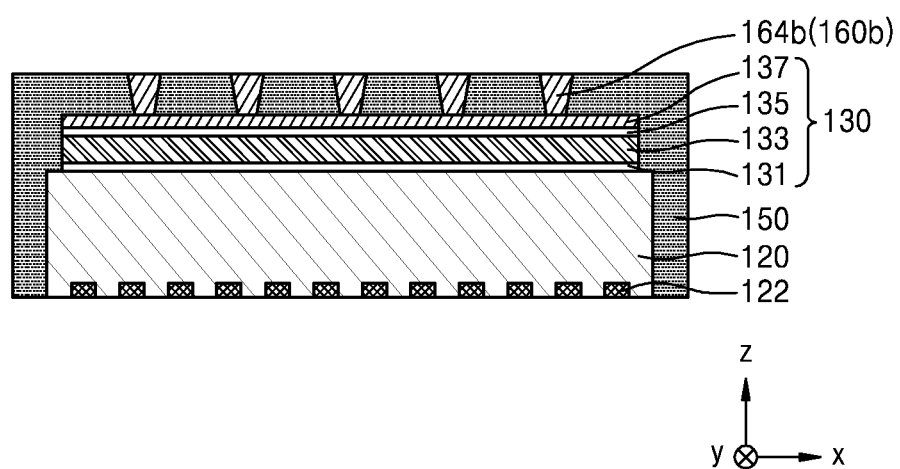

Referring to FIG. 2F, a semiconductor package 100e may include only the second top vias 164b of the previously described top re-wiring layer 160. That is, in the semiconductor package 100e, the second top vias 164b may penetrate the encapsulation member 150 to connect the heat dissipation structure 130. However, the top re-wiring layer 160 (e.g., including the first top wiring layer 162a and the first upper vias 164a) may be formed on the core layer 140.

Figure 2G:
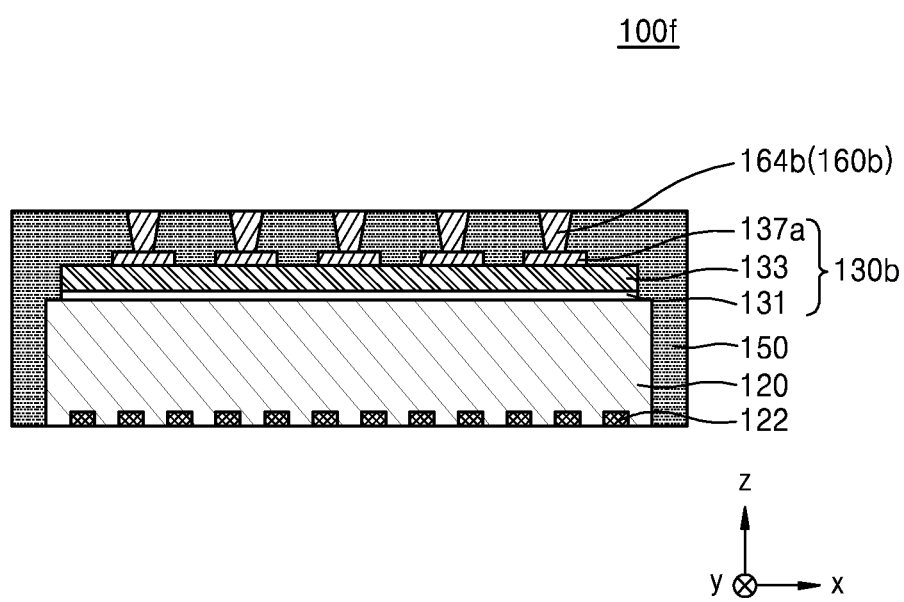

Referring to FIG. 2G, a semiconductor package 100f, like the semiconductor package 100e, may include only the second top vias 164b of the previously described top re-wiring layer 160. That is, in the semiconductor package 100e, the second top vias 164b may penetrate the encapsulation member 150 to connect the heat dissipation structure 130. However, the top re-wiring layer 160 (e.g., including the first top wiring layer 162a and the first upper vias 164a) may be formed on the core layer 140. Moreover, in the semiconductor package 100f, a heat dissipation structure 130b may include the lower adhesive layer 131, the heat dissipation layer 133, and the patterned conductive layer 137a previously described in relation to FIG. 2C.

Figure 2H:
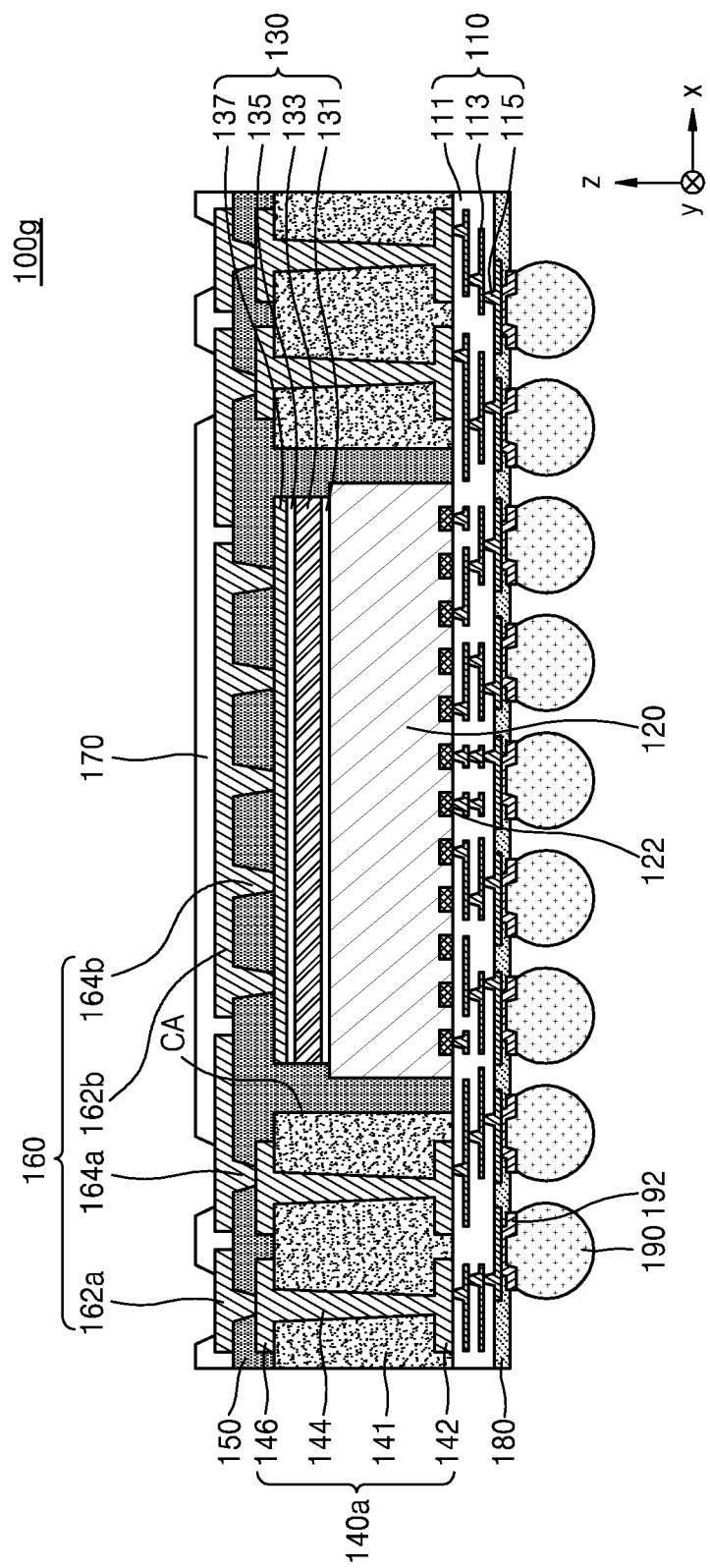

Referring to FIG. 2H, a semiconductor package 100g may include a core layer 140a including; the core insulating layer 141, a through via 144 that penetrates the core insulating layer 141, a lower pad 142 and an upper pad 146. Here, the lower pad 142 provides a bottom surface and the upper pad 146 provides a top surface for the through via 144. The through via 144, the lower pad 142, and the upper pad 146 may differ only in their respective formation method(s) and may perform substantially the same function(s) as the core wire 143 and the core via 145 of the core layer 140 of the semiconductor package 100 of FIG. 1B.

Figure 3A:
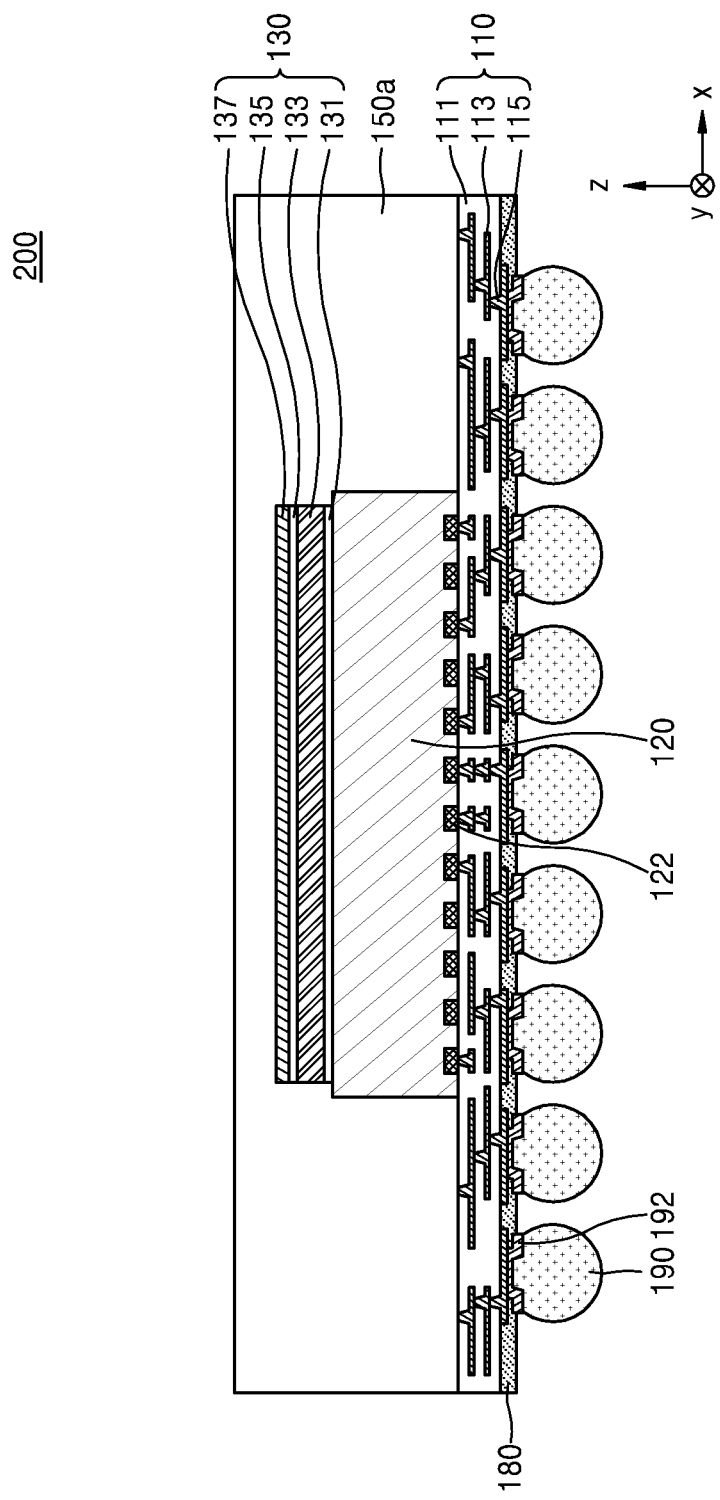
FIGS. 3A, 3B and 3C are related cross-sectional views of a semiconductor package according to embodiments of the inventive concept.
Figure 3B:
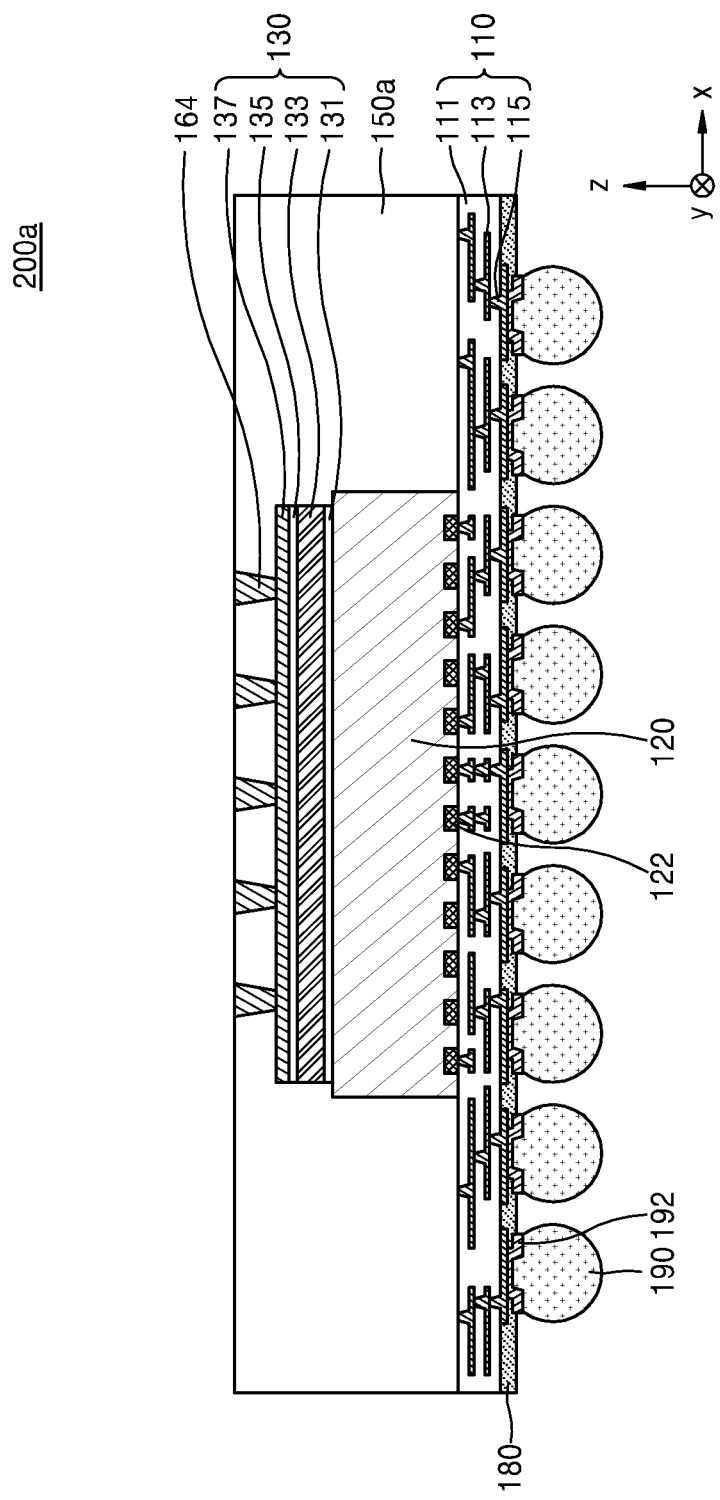
Figure 3C:
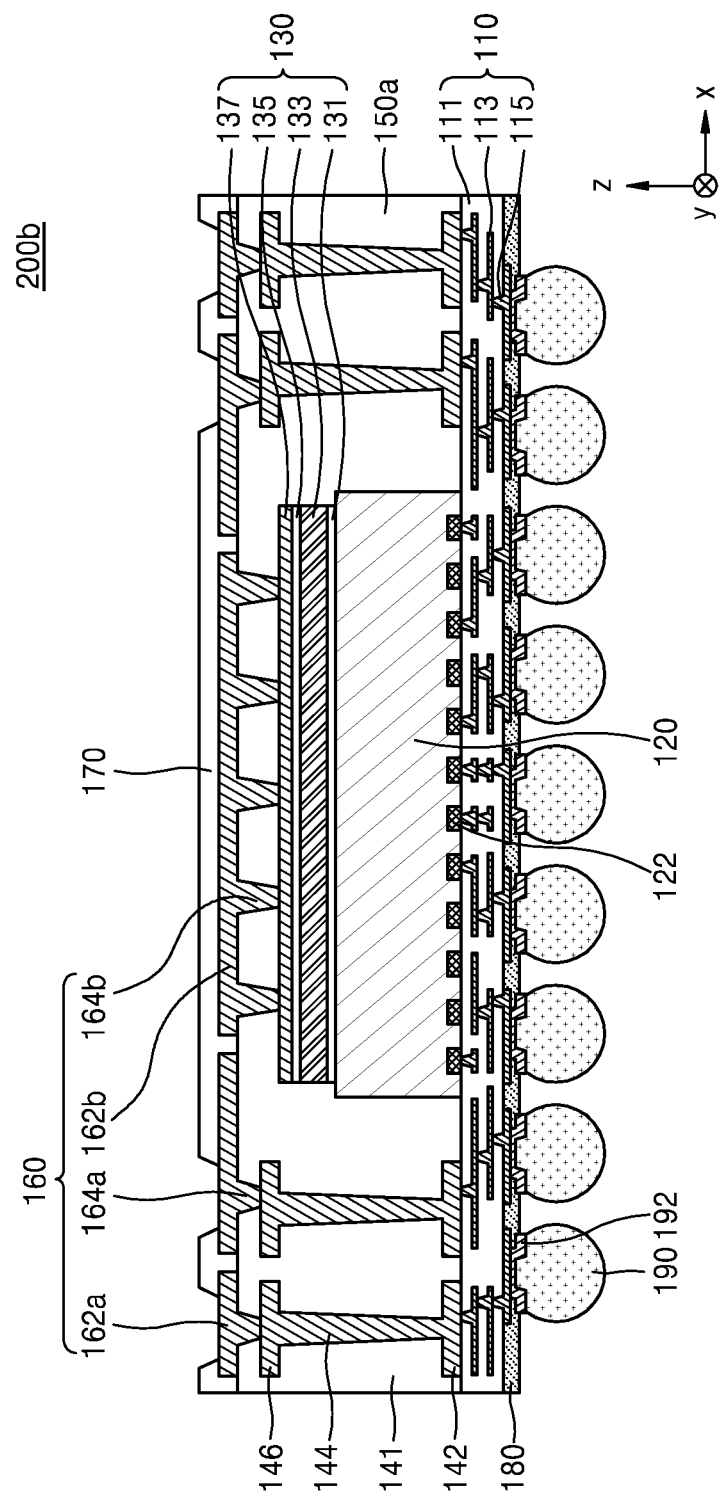

FIGS. 3A, 3B and 3C are related, cross-sectional views further illustrating in one example the fabrication of a semiconductor package according to embodiments of the inventive concept.

Referring to FIG. 3A, a semiconductor package 200 may lack the core layer 140 and the top re-wiring layer 160 of the semiconductor package 100 of FIG. 1B, and instead, include an encapsulation member 150a. Here, the semiconductor package 200 may include the bottom re-wiring layer 110, the semiconductor chip 120, the heat dissipation structure 130, and the encapsulation member 150a. The second passivation layer 180 may also be provided on the bottom surface of the bottom re-wiring layer 110, and the external connection terminal 190 may be provided on the external connection pad 192 formed in an opening of the second passivation layer 180.

The encapsulation member 150a covers and seals the semiconductor chip 120 and the heat dissipation structure 130. However, unlike in the semiconductor package 100 of FIG. 1B, the encapsulation member 150a may cover the top surface of the bottom re-wiring layer 110 together. Accordingly, in the semiconductor package 200, there is no separate core layer, and a second re-wiring layer may not be provided above a core layer or the heat dissipation structure 130. The encapsulation member 150a may include one or more insulating material(s) (e.g., epoxy resin or polyimide).

The semiconductor package 200 may be a wafer level package (WLP). Therefore, the encapsulation member 150a may be formed at the wafer-level. For reference, a method of manufacturing a WLP will be briefly described. First, a plurality of semiconductor chips are stacked on a wafer level support carrier, and all the semiconductor chips may be encapsulated together by an encapsulation member. Thereafter, the support carrier is removed, and bottom re-wiring layers and external connection terminals may be formed on active surfaces of the semiconductor chips. Then, the semiconductor chips may be individualized into individual packages through a sawing process or the like, and thus, a WLP may be fabricated. Moreover, a bottom re-wiring layer redistributes a chip pad of a semiconductor chip to the outside of a chip area, and external connection terminals may be arranged outside the chip area as well as inside the chip area. A WLP having such a structure is referred to as an FO-WLP.

In the case of the semiconductor package 200, the heat dissipation structure 130 may be further provided on the semiconductor chip 120. Therefore, in a wafer level encapsulation process using the encapsulation member 150a, the semiconductor chip 120 and the heat dissipation structure 130 may be encapsulated together. The semiconductor chip 120 and the heat dissipation structure 130 are the same as those described above for the semiconductor package 100 of FIG. 1B.

For reference, the semiconductor package 100 of FIG. 1B may include the core layer 140, and the core layer 140 may be formed at a panel level. Therefore, the semiconductor package 100 of FIG. 1B is referred to as a panel level package (PLP). Also, the semiconductor package 100 of FIG. 1B may correspond to an FO-PLP, because the external connection terminals 190 are also arranged outside the chip area.

Referring to FIG. 3B, a semiconductor package 200a may further include upper vias 164. That is, in the semiconductor package 200a, a plurality of upper vias 164 may penetrate the encapsulation member 150a to connect the heat dissipation structure 130 (e.g., the conductive layer 137). Here, the upper vias 164 may be arranged in a lateral (or 2-dimensional) array like the second top vias 164b of the semiconductor package 100 of FIG. 1B. Accordingly, by forming the upper vias 164, the heat dissipation provided by the heat dissipation structure 130 may be improved.

Referring to FIG. 3C, a semiconductor package 200b may further include the through vias 144 and the top re-wiring layer 160. That is, in the semiconductor package 200b, the through vias 144 may penetrate the encapsulation member 150a, and the lower pad 142 and the upper pad 146 may be provided on the bottom surface and the top surface of the through via 144, respectively. The lower pad 142 may be connected to the bottom re-wiring layer 110, and the upper pad 146 may be connected to the top re-wiring layer 160.

The structure of the top re-wiring layer 160 is the same as that of the top re-wiring layer 160 described in relation to the semiconductor package 100 of FIG. 1B.

Moreover, although the semiconductor packages 200, 200a, and 200b described in relation to FIGS. 3A, 3B and 3C are assumed to include the heat dissipation structure 130 of FIG. 1B, this need not always be the case. For example, the semiconductor packages 200, 200a, and 200b may include one of the heat dissipation structures 130a or 130b of FIG. 2B or 2C. Further, the structure of the top re-wiring layer 160 is not limited to the semiconductor package 100 of FIG. 1B and may include the structure of the top re-wiring layer 160a or 160b of FIG. 2D or 2F.

Also, although semiconductor packages having the FO structure have been described above, the inventive concept is not limited to only semiconductor packages having a FO type structure. For example, other embodiments of the inventive concept and may be applied to semiconductor packages having a FI type structure. That is, semiconductor packages having the FI structure including heat dissipation structures 130, 130a, and 130b of various structures as described above may also belong to the inventive concept.

Figure 4A:
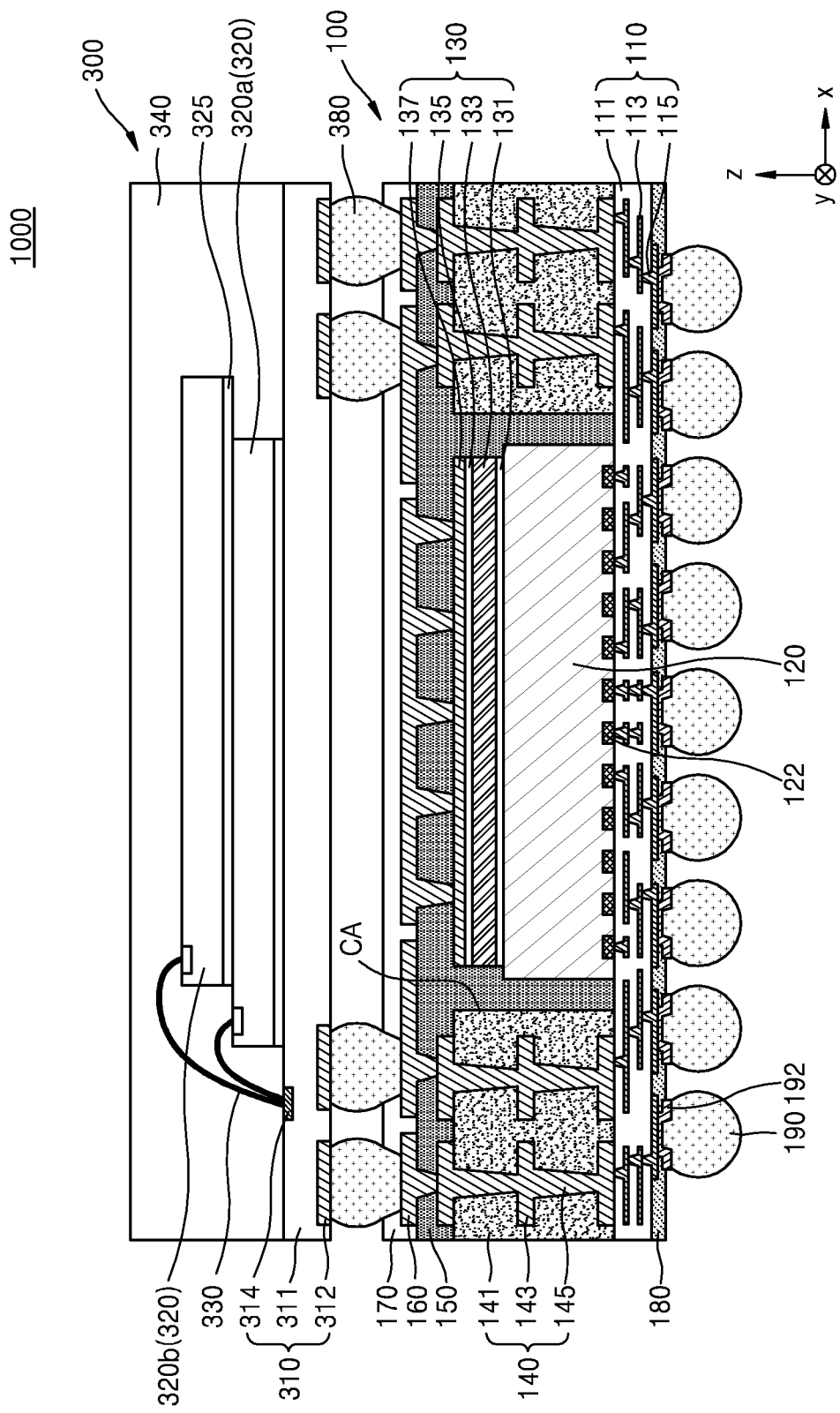
FIGS. 4A and 4B are cross-sectional views of a semiconductor package according to embodiments of the inventive concept.
Figure 4B:
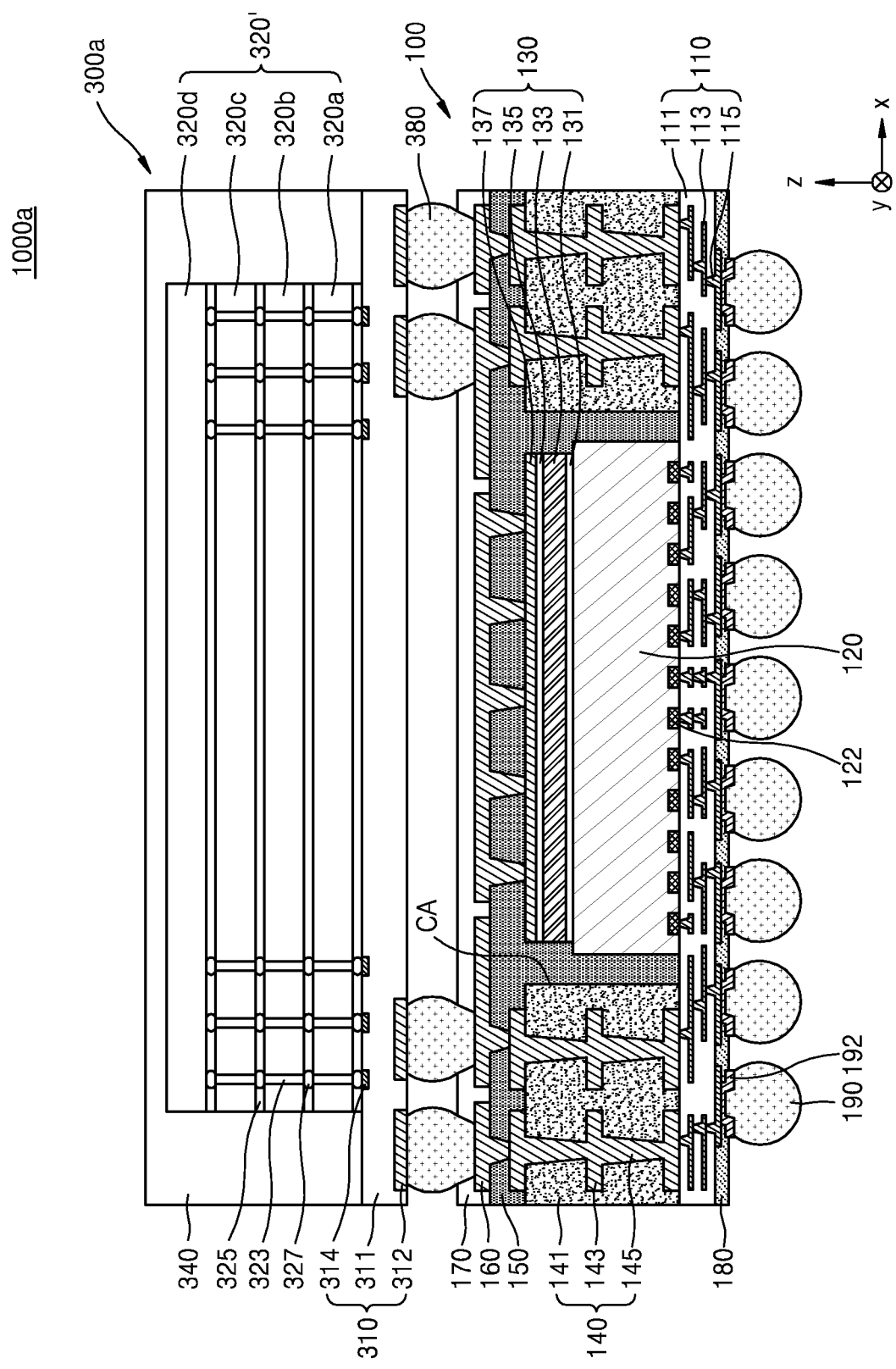

FIGS. 4A and 4B are respective cross-sectional views illustrating semiconductor packages according to embodiments of the inventive concept.

Referring to FIG. 4A, a semiconductor package 1000 may further include (with respect to the semiconductor package 100 of FIG. 1B) an upper package 300. That is, the semiconductor package 1000 may include a lower package 100 (i.e., one of the semiconductor packages previously described in relation to FIG. 1B, FIGS. 2B to 2H, or FIGS. 3A to 3C) together with a vertically stacked upper package 300. A POP technique may be used to stack the upper package 300 on the lower package 100.

The upper package 300 may be stacked on the lower package 100 using an inter-package connection terminal 380. Here, the inter-package connection terminal 380 may include one or more conductive material(s) (e.g., solder, Sn, Ag, Cu, and Al). The upper package 300 may include a package substrate 310, a stacked semiconductor 320, and an upper encapsulation member 340.

The package substrate 310 may include a body 311, a lower pad 312, and an upper pad 314. The package substrate 310 may include at least one material such as silicon, glass, ceramic, or plastic. The package substrate 310 may include a wiring layer having a single layer structure or a multiple layer structure.

The stacked semiconductor 320 may be mounted on the package substrate 310 and electrically connected to the package substrate 310 through a wire 330. The stacked semiconductor 320 may include a plurality of semiconductor chips (e.g., a first semiconductor chip 320a and a second semiconductor chip 320b). However, the stacked semiconductor 320 may include three or more semiconductor chip, or just a single semiconductor chip. When the stacked semiconductor 320 includes a plurality of semiconductor chips, the semiconductor chips may be stacked in a cascaded structure or a zigzag structure.

The first semiconductor chip 320a and the second semiconductor chip 320b may be logic semiconductor chips and/or memory semiconductor chips. For example, in the semiconductor package 1000 of the present embodiment, the semiconductor chip 120 of the lower package 100 may be a logic semiconductor chip, and the first semiconductor chip 320a and the second semiconductor chip 320b of the upper package 300 may be memory semiconductor chips.

The first semiconductor chip 320a may be stacked on the package substrate 310 through an adhesive layer 325, and the second semiconductor chip 320b may be stacked on the first semiconductor chip 320a through the adhesive layer 325. Also, because the first semiconductor chip 320a and the second semiconductor chip 320b are connected to the package substrate 310 through the wire 330, the top surfaces of the first semiconductor chip 320a and the second semiconductor chip 320b may correspond to active surfaces.

The upper encapsulation member 340 may cover the stacked semiconductor 320 to protect the stacked semiconductor 320. Also, the upper encapsulation member 340 may also cover the top surface of the package substrate 310 and the wire 330. The upper encapsulation member 340 may include, for example, a silicone-based material, a thermosetting resin, a thermoplastic resin, and/or a UV treatment material.

Referring to FIG. 4B, a semiconductor package 1000a may include an upper package 300a stacked on the lower package 100 using the inter-package connection terminal 380. The upper package 300a may include a package substrate 310, a stacked semiconductor 320', and an upper encapsulation member 340.

The stacked semiconductor 320' may be mounted on the package substrate 310 and may be electrically connected to the package substrate 310 using through vias 323 and/or micro bumps 327. The stacked semiconductor 320' may include a plurality of semiconductor chips (e.g., first, second, third and fourth semiconductor chips 320a to 320d). However, the stacked semiconductor 320 may include five or more semiconductor chips, or fewer than four semiconductor chips. Moreover, the first, second and third semiconductor chips 320a to 320c may each include the through vias 323. Because the through vias 323 have a structure that penetrates the silicon of a semiconductor chip, the through vias 323 are also referred to as through silicon vias (TSVs).

The first to fourth semiconductor chips 320a to 320d may be logic semiconductor chips and/or memory semiconductor chips. For example, in the semiconductor package 1000a of the present embodiment, the semiconductor chip 120 of the lower package 100 may be a logic semiconductor chip, and the first to fourth semiconductor chips 320a to 320d of the upper package 300a may be memory semiconductor chips.

The first to fourth semiconductor chips 320a to 320d may be stacked on the package substrate 310 and an underlying semiconductor chip using the adhesive layer 325 and the micro bumps 327. In addition, because the first to fourth semiconductor chips 320a to 320d are connected to the package substrate 310 through the through vias 323 and the micro bumps 327 similarly as flip-chips, the bottom surfaces of the first to fourth semiconductor chips 320a to 320d may correspond to active surfaces.

FIGS. 5A, 5B, 5C, 5D, 5E, 5F, and 5G (hereafter collectively, FIGS. 5A to 5G) are related cross-sectional views illustrating in one example a method of fabricating the semiconductor package 100 of FIG. 1B.

Figure 5A:
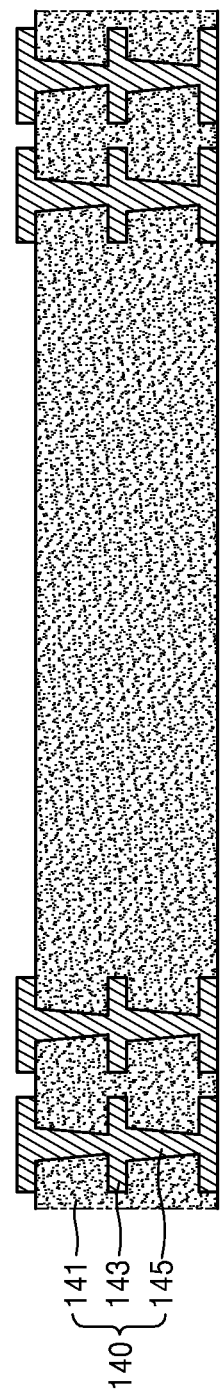

Referring to FIGS. 1B and 5A, the core layer 140 is initially prepared. The core layer 140 may include multiple insulating layers constituting the core insulating layer 141 surrounding, at least in part, the core vias 145 penetrating the respective insulating layers and the core wires 143 on the respective insulating layers. Moreover, according to embodiments, the structure of the core layer 140 may be modified into various structures according to functions of a semiconductor package and methods of manufacturing the core layer 140.

Referring to FIG. 5B, the cavity (e.g., a through hole) CA penetrating the top and bottom surfaces of the core layer 140 is formed in the core layer 140. The cavity CA may be formed in the center of the core layer 140. However, the size, shape, and number cavities may vary according to the size, shape, and number of semiconductor chips 120 to be arranged in the respective cavities. Here, cavity CA may be formed in the core layer 140 using (e.g.) a mechanical drill and/or a laser drill. Alternately, the cavity CA may be formed using a sand blasting technique or a plasma dry etching method.

Figure 5C:
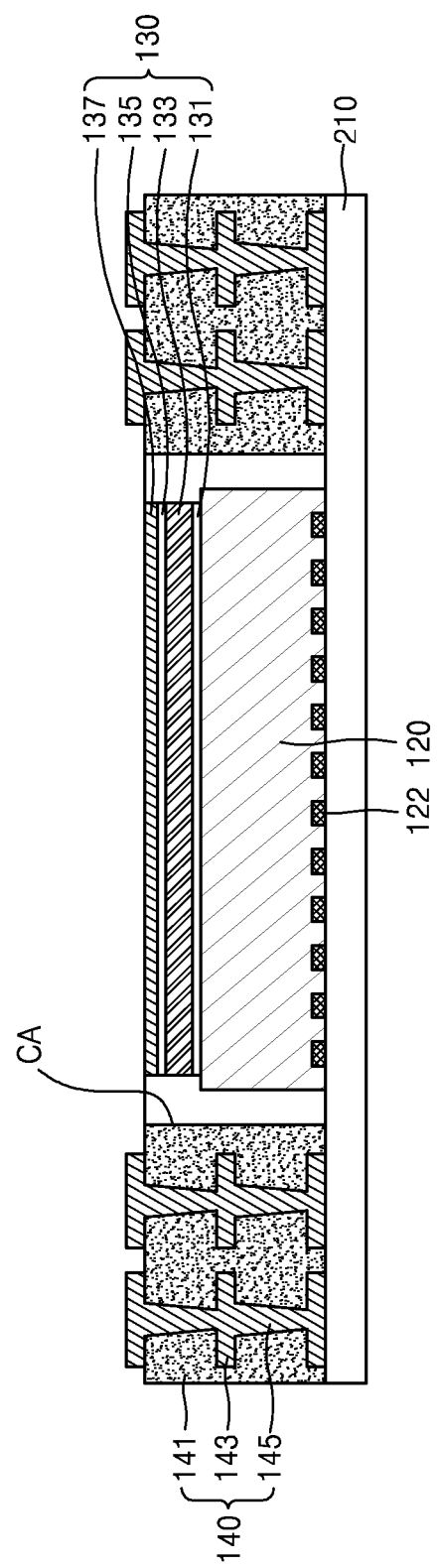

Referring to FIG. 5C, a first supporting layer 210 may be attached to the bottom surface of the core layer 140, and the semiconductor chip 120 and the heat dissipation structure 130 may be stacked in the cavity CA. The first supporting layer 210 may be used to fix the core layer 140 and may be, for example, a thermosetting adhesive tape or ultraviolet curable adhesive tape. The semiconductor chip 120 may be adhered and fixed to the first supporting layer 210 in the cavity CA. The semiconductor chip 120 may be provided in the face-down arrangement such that the chip pads 122 are attached to the first supporting layer 210.

Moreover, a stacked structure of the semiconductor chip 120 and the heat dissipation structure 130 is provided in the through hole CA, wherein the stacked structure of the semiconductor chip 120 and the heat dissipation structure 130 may be formed in various ways. For example, as mentioned in the description of FIG. 1B, the heat dissipation structures 130 may be individually stacked on the semiconductor chip 120, or after the heat dissipation structures 130 are stacked on a semiconductor wafer, wherein the heat dissipation structures 130 may be individualized together with the semiconductor chips 120 using (e.g.) a sawing technique.

Figure 5D:
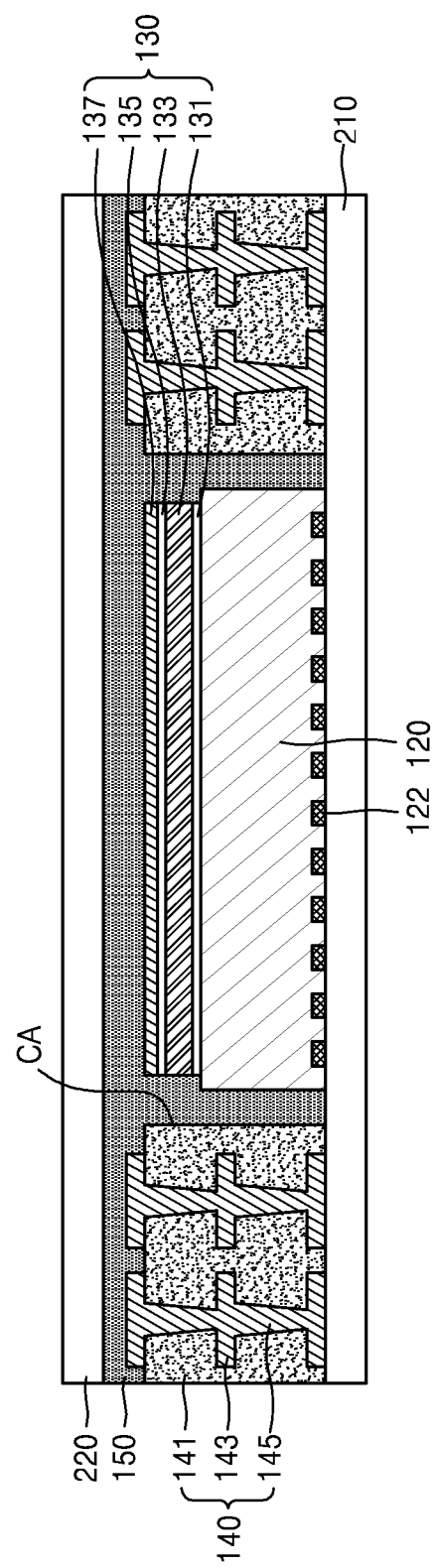

Referring to FIG. 5D, the encapsulation member 150 is formed, and a second supporting layer 220 is formed on the encapsulation member 150. The encapsulation member 150 encapsulates the top surface and side surfaces of the core layer 140 and the heat dissipation structures 130, and a portion of the top surface, which are inactive surfaces, of the semiconductor chip 120 and fills the residual space in the cavity CA. The encapsulation member 150 may be formed by applying a material constituting the encapsulation member 150 on the semiconductor chip 120, the core layer 140 and the heat dissipation structures 130 using a method like lamination, coating, or printing and curing the material. A printing method may be (e.g.) a screen printing method or a spray printing method.

The second supporting layer 220 may be formed on the encapsulation member 150 and may be formed to support a structure including the semiconductor chip 120, the core layer 140, and the encapsulation member 150 during subsequent processing. The material constituting the second supporting layer 220 should be easily removed by subsequent processing.

Figure 5E:
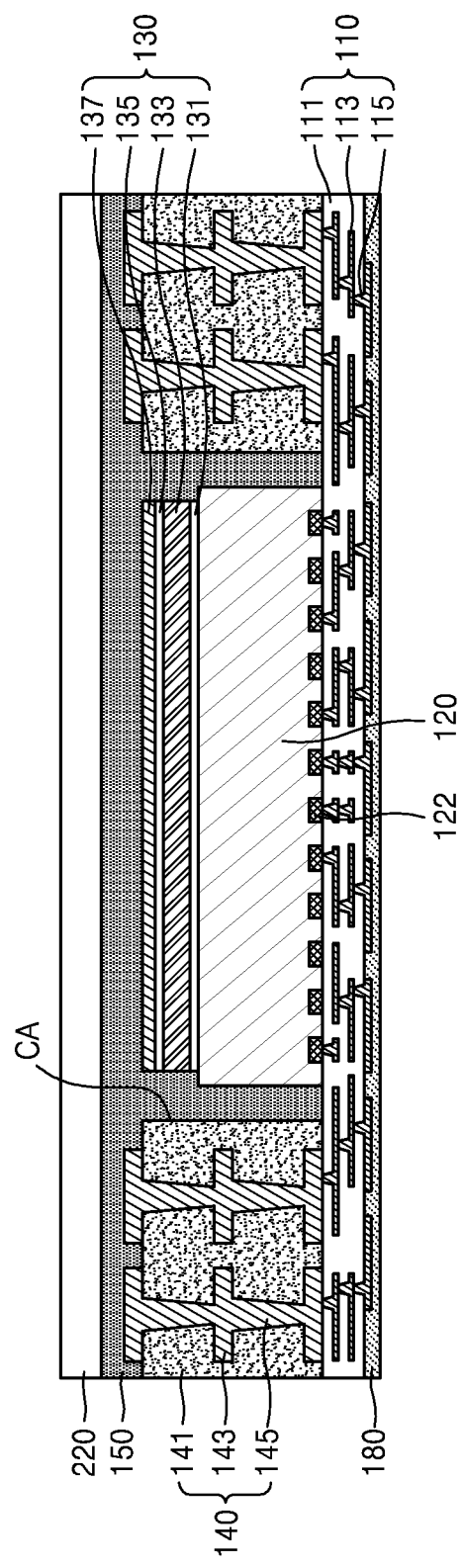

Referring to FIG. 5E, the first supporting layer 210 is removed from the bottom surfaces of the semiconductor chip 120 and the core layer 140, and the bottom re-wiring layer 110 and the second passivation layer 180 may be formed on the bottom surfaces of the semiconductor chip 120 and the core layer 140.

The bottom re-wiring layer 110 may be formed by sequentially forming a plurality of lower insulating layers 111 and forming a bottom re-wiring line 113 and a via 115 on each of the lower insulating layers 111.

The second passivation layer 180 may be formed to cover the bottom surface of the bottom re-wiring layer 110. The second passivation layer 180 may be formed by forming a material constituting the second passivation layer 180 by using a method like lamination, coating, printing, or vapor deposition and curing the material.

Figure 5F:
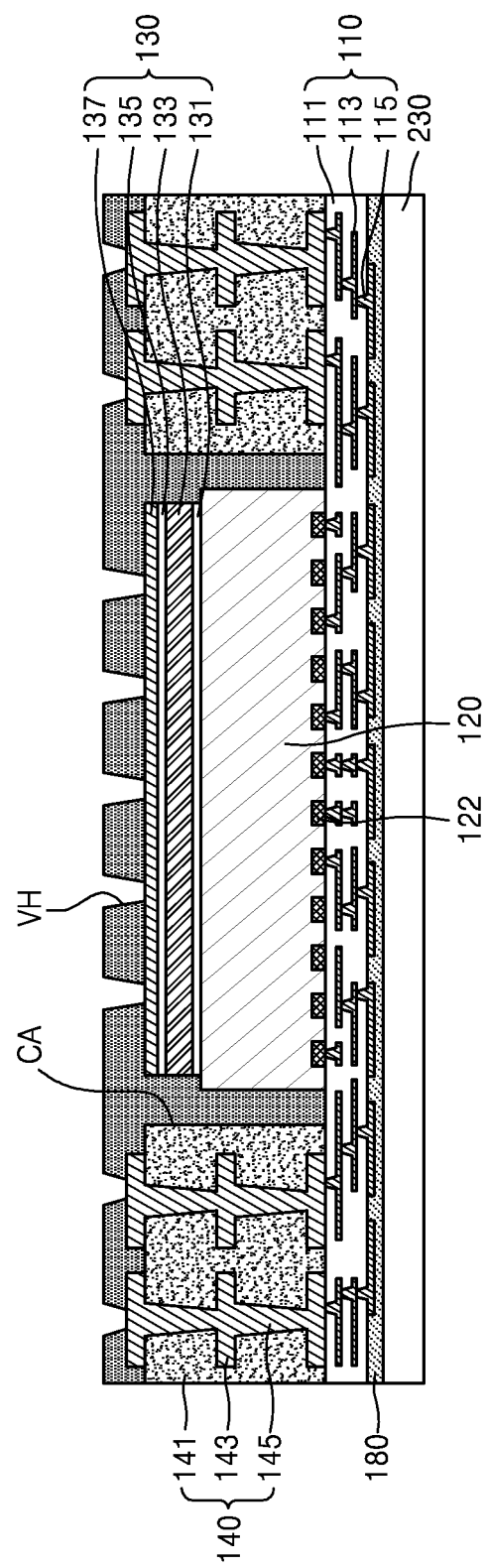

Referring to FIG. 5F, a third supporting layer 230 is formed on the bottom surface of the second passivation layer 180, and the second supporting layer 220 is removed. The third supporting layer 230 may support the structure above the second passivation layer 180. However, in other embodiments, the third supporting layer 230 may be omitted.

Thereafter, via holes VH are formed in the upper portion of the encapsulation member 150. A portion of the top surface of the core wire 143 of the core layer 140 and a portion of the top surface of the conductive layer 137 of the heat dissipation structure 130 may be exposed through the via holes VH. The via holes VH may be formed by patterning the encapsulation member 150 through photolithography or by using a mechanical drill or a laser drill.

Figure 5G:
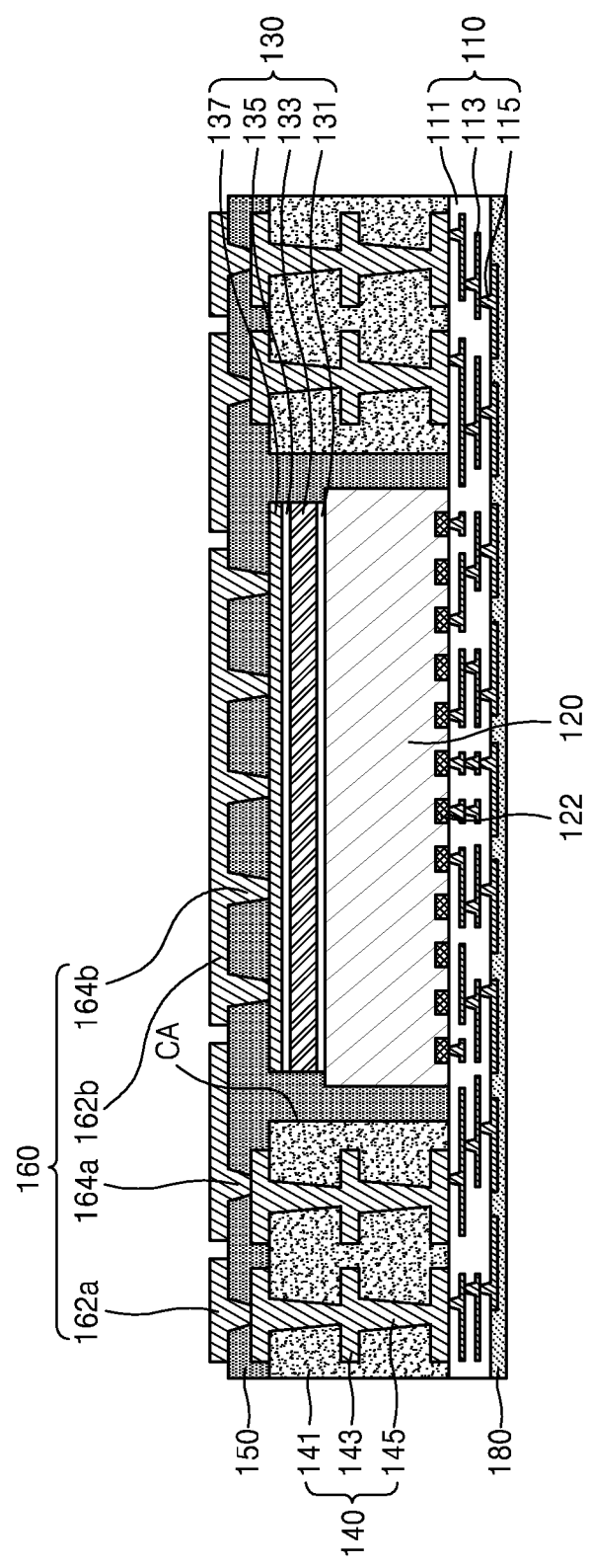

Referring to FIG. 5G, the first upper vias 164a, the second top vias 164b, the first top wiring layer 162a, and the second upper wiring layer 162b are formed to form the top re-wiring layer 160. The first upper vias 164a and the second top vias 164b may be formed by filling the via holes VH with one or more conductive material(s). For example, the first upper vias 164a and the second top vias 164b may be formed using a plating process. Furthermore, the first top wiring layer 162a and the second upper wiring layer 162b may also be formed using a plating process. However, the process of forming the first top wiring layer 162a and the second upper wiring layer 162b is not limited thereto. For example, the first top wiring layer 162a and the second upper wiring layer 162b may be formed by laminating a copper foil and patterning the same.

Thereafter, the first passivation layer 170 having openings formed therein is formed on the top re-wiring layer 160. Subsequently, an opening exposing a portion of the first re-wiring line 113 is formed in the bottom surface of the second passivation layer 180, and the external connection pad 192 and the external connection terminal 190 are formed on the opening.

The external connection pad 192 and the external connection terminal 190 may be formed through a deposition process or a plating process. A reflow process may be used in the process of forming the external connection terminal 190. The above processes may be performed at the wafer level or the panel level. Subsequently, semiconductor packages are separated through a sawing process, and thus, the semiconductor package 100 of FIG. 1B may be manufactured.

While the inventive concept has been particularly shown and described with reference to embodiments thereof, it will be understood that various changes in form and details may be made therein without departing from the spirit and scope of the following claims.

What is claimed is:

1. A semiconductor package comprising:
    a semiconductor chip including a planar top surface and an opposing bottom surface;
    a heat dissipation structure including a lower adhesive layer adhered to the planar top surface of the semiconductor chip, a heat dissipation layer disposed on the lower adhesive layer, and a conductive layer disposed on the heat dissipation layer;
    a core layer including a cavity and a lower surface, wherein a combination of the semiconductor chip and the heat dissipation structure is disposed within the cavity; and
    a bottom re-wiring layer including a bottom re-wiring line connected to the semiconductor chip,
    wherein the heat dissipation structure further includes an upper adhesive layer disposed between the heat dissipation layer and the conductive layer,
    wherein a footprint of the heat dissipation structure on the planar top surface of the semiconductor chip in a plan view has an area smaller than a surface area of the planar top surface of the semiconductor chip, and the heat dissipation structure is disposed only on the planar top surface of the semiconductor chip, and
    wherein the heat dissipation structure has a structure in which the lower adhesive layer, the heat dissipation layer, the upper adhesive layer and the conductive layer are sequentially disposed on the semiconductor chip in a flat plate form without holes.

2. The semiconductor package of claim 1, wherein the bottom re-wiring layer includes a bottom surface including a first portion underlying the bottom surface of the semiconductor chip and a second portion underlaying the lower surface of the core layer.

3. The semiconductor package of claim 2, wherein the semiconductor package is a fan-out type semiconductor package further comprising:
    a first external connection pad disposed on the first portion of the bottom surface of the bottom re-wiring layer and a first external connection terminal connected to the first external connection pad; and
    a second external connection pad disposed on the second portion of the bottom surface of the bottom re-wiring layer and a second external connection terminal connected to the second external connection pad.

4. The semiconductor package of claim 1, further comprising:
    an encapsulation member filling a space between the combination of the semiconductor chip and the heat dissipation structure and the core layer, and covering a top surface of the heat dissipation structure; and
    a via that penetrates the encapsulation member to the heat dissipation structure.

5. The semiconductor package of claim 4, wherein the core layer further comprises internal wires, the semiconductor package further comprising:
    a top re-wiring layer provided on the heat dissipation structure and the core layer,
    wherein the bottom re-wiring layer is connected to the top re-wiring layer through the internal wires of the core layer, and
    the conductive layer is connected to the top re-wiring layer by the via.

6. The semiconductor package of claim 1, wherein the heat dissipation layer includes graphite.

7. The semiconductor package of claim 6, wherein the conductive layer covers at least part of the heat dissipation layer.

8. The semiconductor package of claim 7, further comprising:
    an encapsulation member filling a space between the combination of the semiconductor chip and the heat dissipation structure and the core layer, and covering a top surface of the heat dissipation structure; and
    a top re-wiring layer disposed on the heat dissipation structure and the core layer,
    wherein a plurality of vias penetrate the encapsulation member to connect the conductive layer and the top re-wiring layer.

9. The semiconductor package of claim 1, further comprising:
a top re-wiring layer provided on the heat dissipation structure and the core layer, and an upper package stacked on the top re-wiring layer and including at least another semiconductor chip.

10. A semiconductor package comprising:
a core layer including a top surface, an opposing bottom surface and a cavity;
a semiconductor chip including a planar top surface, an opposing bottom surface and chip pads connected to the bottom surface of the semiconductor chip;
a heat dissipation structure disposed on the planar top surface of the semiconductor chip, wherein a combination of the semiconductor chip and the heat dissipation structure is fully disposed within the cavity, and the heat dissipation structure includes a lower adhesive layer adhered to the planar top surface of the semiconductor chip, a heat dissipation layer disposed on the lower adhesive layer, a conductive layer disposed on the heat dissipation layer, and an upper adhesive layer adhered between the conductive layer and the heat dissipation layer;
a bottom re-wiring layer disposed on the bottom surface of the semiconductor chip and the bottom surface of the core layer, and including a bottom re-wiring line connected to at least one of the chip pads;
an encapsulation member filling a space between the combination of the semiconductor chip and the heat dissipation structure and the core layer, and covering a top surface of the heat dissipation structure; and
a top re-wiring layer disposed on the planar top surface of the semiconductor chip and the top surface of the core layer, including a top re-wiring line connected to the semiconductor chip, and further including at least one via that penetrates the encapsulation member to connect the conductive layer,
wherein a footprint of the heat dissipation structure on the planar top surface of the semiconductor chip in a plan view has an area smaller than a surface area of the planar top surface of the semiconductor chip, and the heat dissipation structure is disposed only on the planar top surface of the semiconductor chip, and
wherein the heat dissipation structure has a structure in which the lower adhesive layer, the heat dissipation layer, the upper adhesive layer and the conductive layer are sequentially disposed on the semiconductor chip in a flat plate form without holes.

11. The semiconductor package of claim 10, wherein the cavity has a shape selected from a group of shapes including a rectangle, a circle, an ellipse, and a polygon.

12. The semiconductor package of claim 10, wherein the core layer further comprises internal wires, and
the bottom re-wiring layer is connected to the top re-wiring layer through the internal wires of the core layer.

13. The semiconductor package of claim 10, wherein the top surface of the heat dissipation structure and the top surface of the core layer are substantially coplanar,
the heat dissipation structure has a thickness in a range of from 40 μm to 70 μm, and
the heat dissipation layer has a thickness in a range of from 20 μm to 30 μm.

14. The semiconductor package of claim 10, wherein the conductive layer entirely covers the heat dissipation layer.

15. A semiconductor package comprising:
a lower semiconductor package including a semiconductor chip including a planar top surface, an opposing bottom surface, and an upper semiconductor package stacked on the lower semiconductor package and including another semiconductor chip, wherein the lower semiconductor package further comprises
a core layer including a top surface, an opposing bottom surface, internal wires and a cavity;
a heat dissipation structure disposed on the planar top surface of the semiconductor chip, wherein a combination of the semiconductor chip and the heat dissipation structure is fully disposed within the cavity, and the heat dissipation structure includes a lower adhesive layer adhered to the planar top surface of the semiconductor chip, a heat dissipation layer disposed on the lower adhesive layer, and a conductive layer disposed on the heat dissipation layer with an upper adhesive layer therebetween;
a bottom re-wiring layer disposed on the bottom surface of the semiconductor chip and the bottom surface of the core layer, and including a bottom re-wiring line;
an encapsulation member filling a space between the combination of the semiconductor chip and the heat dissipation structure and the core layer, and covering a top surface of the heat dissipation structure; and
a top re-wiring layer disposed on the planar top surface of the semiconductor chip and the top surface of the core layer and including a top re-wiring line connected to the semiconductor chip,
wherein a footprint of the heat dissipation structure on the planar top surface of the semiconductor chip in a plan view has an area smaller than a surface area of the planar top surface of the semiconductor chip, and the heat dissipation structure is disposed only on the planar top surface of the semiconductor chip, and
wherein the heat dissipation structure has a structure in which the lower adhesive layer, the heat dissipation layer, the upper adhesive layer and the conductive layer are sequentially disposed on the semiconductor chip in a flat plate form without holes.

16. The semiconductor package of claim 15, wherein the bottom re-wiring line is connected to the top re-wiring layer through the internal wires of the core layer, and
a plurality of vias penetrating the encapsulation member to connect the conductive layer and the top re-wiring layer.

17. The semiconductor package of claim 15, wherein the heat dissipation layer includes graphite.

18. The semiconductor package of claim 15, wherein the conductive layer entirely covers the heat dissipation layer.

19. The semiconductor package of claim 15, wherein the top surface of the heat dissipation structure and the top surface of the core layer are substantially coplanar, and
an external connection terminal is provided in a fan-out structure on a bottom surface of the bottom re-wiring layer.

* * * * *